United States Patent [19]

Ueda

[11] Patent Number: 5,345,393
[45] Date of Patent: Sep. 6, 1994

[54] LOGIC CIRCUIT GENERATOR
[75] Inventor: Masahiko Ueda, Kashiwara, Japan
[73] Assignee: Matsushita Electric Industrial Co., Ltd., Kadoma, Japan
[21] Appl. No.: 748,651
[22] Filed: Aug. 22, 1991
[30] Foreign Application Priority Data Aug. 22, 1990 [JP] Japan .................. 2-222080

[51] Int. Cl.$^5$ ............... G06F 15/60; G06F 11/00
[52] U.S. Cl. ..................... 364/489; 364/491; 364/570; 371/23
[58] Field of Search ........... 364/488, 489, 578; 371/27, 23, 213

[56] References Cited

U.S. PATENT DOCUMENTS

| | | | |
|---|---|---|---|
| 4,669,081 | 3/1987 | Mathews, Jr. et al. | 371/3 |
| 4,703,435 | 10/1987 | Darringer et al. | 364/489 |
| 4,791,578 | 12/1988 | Fazio et al. | 364/488 |
| 4,896,272 | 1/1990 | Kurosawa | 364/489 |
| 4,937,765 | 6/1990 | Shupe et al. | 364/488 |
| 4,964,056 | 10/1990 | Bekki et al. | 364/488 |
| 5,010,552 | 4/1991 | Dias et al. | 371/27 |
| 5,032,783 | 6/1991 | Hwang et al. | 324/73.1 |
| 5,051,938 | 9/1991 | Hyduke | 364/488 |
| 5,111,459 | 5/1992 | Devigne | 371/27 |
| 5,146,583 | 9/1992 | Matsunaka et al. | 364/489 |

Primary Examiner—Thomas G. Black
Assistant Examiner—Tan Q. Nguyen
Attorney, Agent, or Firm—Willian Brinks Hofer Gilson & Lione

[57] ABSTRACT

There is disclosed a logic circuit generator for automatically synthesizing a logic circuit from a given functional description which comprises a logic circuit synthesizing device for synthesizing a logic circuit from the given functional description, a test vector generator for generating a test vector for analyzing the logic circuit synthesized, by executing a fault simulation regarding the logic circuit with use of the test vector in order to evaluate a fault detection rate regarding the test vector and to obtain a list of undetected faults, and a converter for converting the logic circuit according to the list of undetected faults when the fault detection rate is judged to be not sufficiently high.

6 Claims, 19 Drawing Sheets

```
if (a == 0)
        r = 0;
else  if (a == 1)
        r = d;
else  if (a == 2)
        r = e;
```

| u | v | x | y |
|---|---|---|---|
| 1 | 0 | 1 | 1 |
| 0 | 0 | 1 | 0 |
| 1 | 1 | 0 | 1 |
| 1 | 0 | 1 | 0 |
| 0 | 1 | 0 | 0 |
| 0 | 1 | 0 | 1 |
| 0 | 1 | 1 | 1 |

LOGIC CIRCUIT GENERATOR

BACKGROUND OF THE INVENTION

1. Field of the Invention

The present invention generally relates to an automatic logic synthesis technique for automatizing logic circuit design and, more particularly, to a logic circuit generator for generating highly testable logic circuits.

2. Description of the Prior Art

In a typical logic circuit generator, testability of a logic circuit generated thereby is not usually considered a priority. Accordingly, it often becomes necessary to correct the logic circuit having been generated in order to improve the testability thereof.

Shown in FIG. 19 is a flow chart illustrating a logic circuit design method using the typical conventional logic circuit generator.

In step 41 a test circuit is inserted to a logic circuit generated by the logic circuit generator or designed manually. Typically, a test circuit so called "scan path" is inserted therein. This step is performed manually by an operator or automatically by a computer. In step 42, formation of test vectors is performed by analyzing the logic circuit wherein the test circuit has been inserted. This step is also performed manually by a circuit designer using test vectors provided for logical check or automatically by the computer. In step 43, a fault simulation is executed for the logic circuit using test vectors formed in step 42 to obtain a fault detection rate. The fault detection rate is evaluated to determine if it is sufficiently high or not in step 44. If it is evaluated sufficiently high, the test design is completed. If it is not, the flow returns to the step 42 for formation of test vectors to add a further test vector, or to the step 41 for test circuit insertion to correct the logic circuit.

Shown in FIG. 20 is a block diagram of a first example of the conventional logic circuit generator in which testability is taken into consideration. In the figure, reference numeral 51 denotes a logic synthesizing means for synthesizing a logic circuit satisfying given functions according to a functional description about a logic circuit input beforehand; 52 denotes a scan-path inserting means for inserting a scan path to a logic circuit synthesized by the logic synthesizing means 51 for testing; and 53 denotes a circuit optimizing means for eliminating redundancy of the logic circuit generated from the insertion of the scan path.

In the scan-path inserting means 52, flip-flops contained in a logic circuit are replaced with scan-path use flip-flops having the function of shift registers and the flip-flops are sequentially connected into one scan path. Also, a scan data I/O port and a scan-use clock input port are inserted thereinto. It is known that the logic circuit into which a scan path is thus inserted can be easily tested by setting data into or reading data from the flip-flops through the scan path in testing.

Shown in FIG. 21 is a block diagram of a second example of the conventional logic circuit generator in which testability is taken into consideration. In the figure, a reference numeral 61 denotes a function-level testability analyzing means for analyzing the testability of a circuit in a functional level according to a functional description about a logic circuit input beforehand; 62 denotes a function-level scan-path inserting means for modifying the original functional description so as to include a scan path, if necessary, according to results of analysis obtained; and 63 denotes a logic synthesizing means for synthesizing a logic circuit from the functional description to which a scan path is thus added.

The logic circuit generated by the conventional logic circuit generator as described above includes a scan path as in the first example of the counterpart, whereby it is easy to test. Moreover, it has a scan path that is inserted thereinto only when required, according to results of analysis regarding the testability in a function level, thus affording an advantage that the resulting test circuit requires only low cost as compared with the first conventional counterpart.

Although it is necessary to take the testability of a logic circuit into consideration upon forming the functional description thereof in order to obtain a logic circuit having a high testability using the conventional logic circuit generator (wherein the testability is not taken into consideration), there is no guarantee that a high ratio of fault detection is obtained according to this method since it is difficult to exactly estimate the testability of a logic circuit to be generated in a functional level.

In the method for inserting a test circuit into the logic circuit generated according to the test design flow shown in FIG. 19, it is difficult for the designer to correct the logic circuit. Further, there are some problems that redundancy is generated in the logic circuit after conversion, and restrictions in the design which were satisfied before conversion are not satisfied after conversion, due to an automatic replacement that takes only the testability into consideration in those cases where the test circuit is automatically inserted by the computer.

In the first example of the conventional logic circuit generator shown in FIG. 20, in which testability is taken into consideration, the testability of a synthesized logic circuit is not analyzed. Therefore, all the flip-flops must be replaced with scan-path use ones, causing the cost for generated logic circuits to be increased to a great extent.

In the second example of the conventional logic circuit generator shown in FIG. 21, in which testability is taken into consideration, the testability is evaluated in not logic level but function level. However, since accurate testability analysis of the generated logic circuit is difficult in the function level, it may cause an insufficiently high fault detection ratio, or an increase in cost since the test circuit will be excessively large.

SUMMARY OF THE INVENTION

Accordingly, in view of the foregoing problems, an essential object of the present invention is to provide a logic circuit generator which automatically generates a logic circuit having a sufficiently high testability and requires only low costs for producing the resulting test circuit.

In accomplishing these and other objects, a logic circuit generator as will be set forth in claim 1 hereinafter comprises: logic synthesizing means for synthesizing a logic circuit that implements a given function according to an input functional description; logic-level test vector generating means for generating a test vector for use in fault detection by analyzing the logic circuit synthesized by the logic synthesizing means and further for outputting a fault detection ratio of the generated test vector and testability analysis result; judging means for deciding whether or not the fault detection ratio output from the logic-level test vector generating means is sufficiently high; and circuit converting means for, when it is decided as a result of the above decision that the fault detection ratio is insufficient, converting the logic circuit synthesized by the logic synthesizing means according to the testability analysis result output from the logic-level test vector generating means.

A logic circuit generator as will be set forth in claim 2 hereinafter comprises: logic synthesizing means for synthesizing a logic circuit that implements a given function according to an input functional description; function-level test vector generating means for generating a test vector for use in fault detection from the input functional description; fault simulating means for performing fault simulation with respect to the logic circuit synthesized by the logic synthesizing means using the test vector generated by the function-level test vector generating means and further for outputting the fault detection ratio and testability analysis result of the test vector; judging means for deciding whether or not the fault detection ratio output from the fault simulating means is sufficiently high; and circuit converting means for, when it is decided as a result of the above decision that the fault detection ratio is insufficient, converting the logic circuit synthesized by the logic synthesizing means according to the testability analysis result output from the fault simulating means.

A logic circuit generator as will be set forth in claim 3 hereinafter comprises: logic synthesizing means for synthesizing a logic circuit that implements a given function according to an input functional description; function-level test vector generating means for generating a first test vector from the input functional description; fault simulating means for performing fault simulation with respect to the logic circuit synthesized by the logic synthesizing means using the first test vector generated by the function-level test vector generating means and further for outputting a fault detection ratio of the first test vector and an undetected fault list; judging means for deciding whether or not the fault detection ratio is sufficiently high; logic-level test vector generating means for generating a second test vector by analyzing the logic circuit according to the undetected fault list, and further for outputting a fault detection ratio and testability analysis result obtained when the generated second test vector and the first test vector are combined together; and circuit converting means for converting the logic circuit according to the testability analysis result.

In the logic circuit generator according to claim 1 of the present invention, a logic circuit synthesized by the logic synthesizing means from an input functional description is analyzed by the logic-level test vector generating means so as to evaluate a fault detection ratio.

The judging means decides whether or not the fault detection ratio is sufficiently high; if it is, the logic circuit synthesized by the logic synthesizing means is output as it is, along with the test vector generated by the logic-level test vector generating means.

If the fault detection ratio is insufficient, the circuit converting means renders circuit conversion for enhancing the testability of the logic circuit synthesized by the logic synthesizing means, according to a testability analysis result output from the logic-level test vector generating means, thus enabling the generation of a highly testable logic circuit.

In the logic circuit generator according to claim 2 of the present invention, a logic circuit synthesized by the logic synthesizing means from an input functional description is subjected to fault simulation using the test vector generated by the function-level test vector generating means from the input functional description so as to evaluate a fault detection ratio.

The judging means decides whether or not the fault detection ratio is sufficiently high; if it is, the logic circuit synthesized by the logic synthesizing means is output as it is, along with the test vector generated by the function-level test vector generating means.

If the fault detection ratio is insufficient, the circuit converting means renders circuit conversion for enhancing the testability of the logic circuit synthesized by the logic synthesizing means, according to a testability analysis result output from the fault simulating means, thus enabling the generation of a highly testable logic circuit.

In the logic circuit generator according to claim 3 of the present invention, a logic circuit synthesized by the logic synthesizing means from an input functional description is subjected to fault simulation using the first test vector generated by the function-level test vector generating means from the input functional description so as to evaluate a first fault detection ratio.

The judging means decides whether or not the first fault detection ratio is sufficiently high; if it is, the logic circuit synthesized by the logic synthesizing means is output as it is, along with the test vector generated by the function-level test vector generating means.

If the first fault detection ratio is insufficient, the logic-level test vector generating means analyzes the logic circuit synthesized by the logic synthesizing means according to the undetected fault list output from the fault simulating means in order to generate a second test vector for complementing the first test vector, and further to evaluate a second fault detection ratio obtained when the first and second test vectors are combined together.

The judging means decides whether or not the second fault detection ratio is sufficiently high; if it is, the logic circuit synthesized by the logic synthesizing means is output as it is, along with the first and second test vectors.

If the fault detection ratio is insufficient, the circuit converting means renders circuit conversion for enhancing the testability of the logic circuit synthesized by the logic synthesizing means, according to a testability analysis result output from the logic-level test vector generating means, thus enabling the generation of a highly testable logic circuit.

BRIEF DESCRIPTION OF THE DRAWINGS

These and other objects and features for the present invention will become apparent from the following description taken in conjunction with the preferred embodiment thereof with reference to the accompanying drawings, in which.

DETAILED DESCRIPTION OF THE INVENTION

Figure 1:
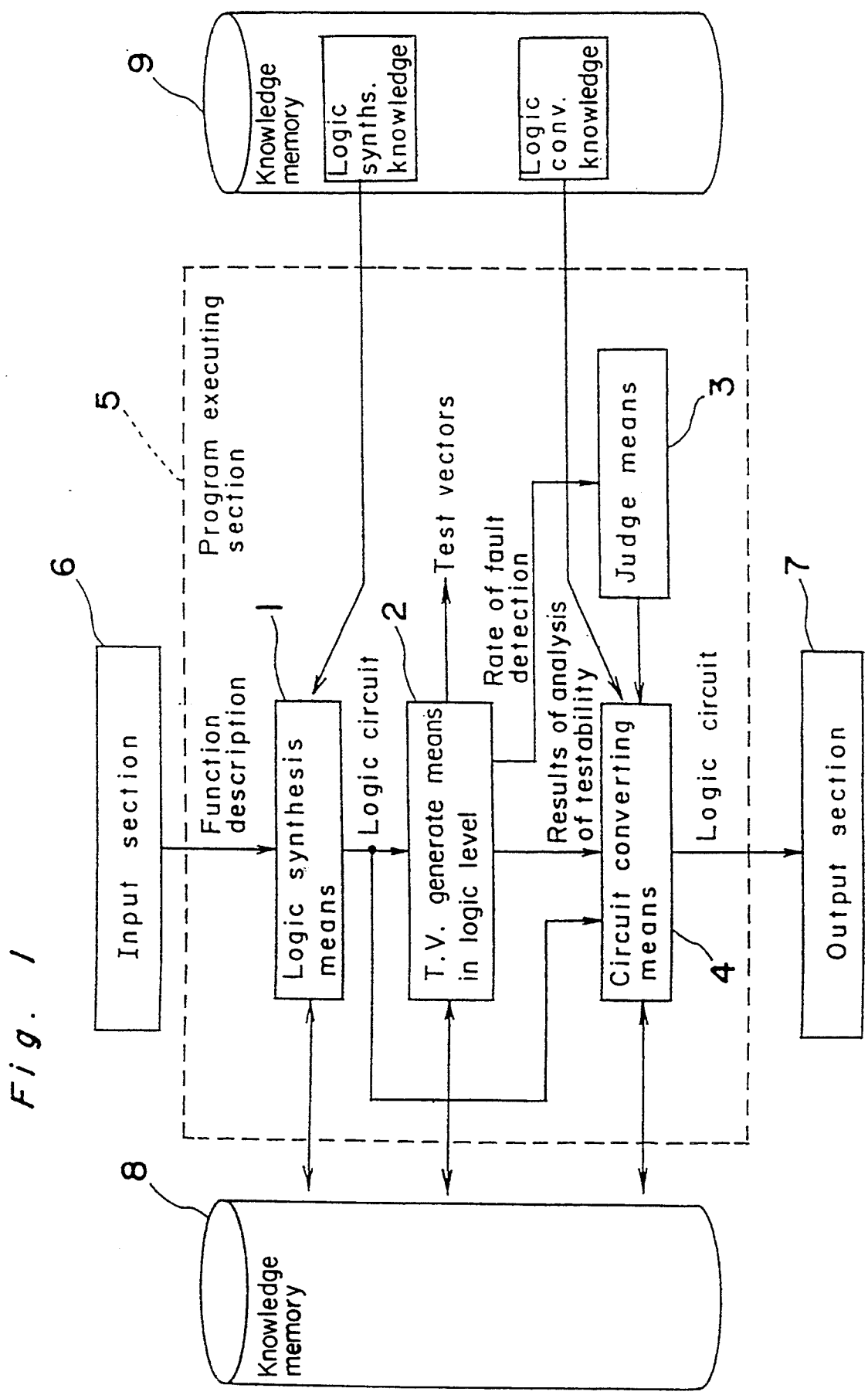
FIG. 1 is a block diagram showing the construction of an embodiment of the logic circuit generator according to claim 1 of the present invention.

Before the description of the present invention proceeds, it is to be noted that like parts are designated by like reference numerals throughout the accompanying drawings.

FIG. 1 is a block diagram showing the construction of a preferred embodiment of the logic circuit generator according to the present invention. Referring to FIG. 1, reference numeral 1 denotes a logic synthesizing means for synthesizing a logic circuit that implements given functions according to an input functional description; 2 denotes a logic-level test vector generating means for generating test vectors in a logic level for use in fault detection by analyzing the logic circuit synthesized by the logic synthesizing means 1, and further for outputting a fault detection rate and results of a testability analysis result, which is a list of undetected faults, of the generated test vector; 3 denotes a judging means for deciding whether or not the fault detection rate outputted from the logic-level test vector generating means 2 is sufficiently high; 4 denotes a circuit converting means for, when it is decided by the decision means 3 that the fault detection rate is insufficient, converting the logic circuit synthesized by the logic synthesizing means 1 according to the undetected fault list output from the logic-level test vector generating means 2; 5 denotes a program execution section for storing a logic circuit generation program including said logic synthesizing means 1, logic-level test vector generating means 2, judging means 3 and circuit converting means 4, and executing said program according to the necessity thereof; 6 denotes an input section for helping in formation of a functional description and transmitting the functional description formed to the program execution section 5; 7 denotes an output section for converting the logic circuit synthesized by the program execution section 5 to available forms such as logic diagrams, set lists and the like and outputting those obtained thereby; 8 denotes a work memory section for memorizing intermediate data generated by the program execution section 5 temporally; and 9 denotes a knowledge memory section for memorizing knowledge about the logic synthesis to be referred to by the logic synthesizing means 1 and about the circuit conversion to be referred to by the circuit converting means 4.

The embodiment of the present invention constructed as above is now described below with regard to the operation thereof.

First, a logic circuit synthesized by the logic synthesizing means 1 from the input functional description 6 is analyzed by the logic-level test vector generating means 2 thereby to evaluate a fault detection rate.

The judging means 3 judges whether or not the fault detection rate is sufficiently high; if it is, the logic circuit synthesized by the logic synthesizing means 1 is outputted as it is, along with test vectors generated by the logic-level test vector generating means 2.

If the fault detection rate is insufficient as a result of the judgement by the judging means 3, the circuit converting means 4 renders a circuit conversion for enhancing the testability of the logic circuit synthesized by the logic synthesizing means 1 according to an undetected fault list output from the logic-level test vector generating means 2 in order to obtain an easily testable logic circuit.

The easily testable logic circuit is again analyzed by the logic-level test vector generating means 2 to evaluate the new fault detection rate thereabout. This procedure is repeated until a sufficiently high fault detection rate is obtained or until the number of evaluations exceeds a predetermined maximum value.

Further, if it becomes impossible to satisfy given design restrictions as the result of the circuit conversion, parameters related to the logic synthesis are altered and another logic circuit can be synthesized by the logic synthesizing means 1 using new parameters.

Figure 22:
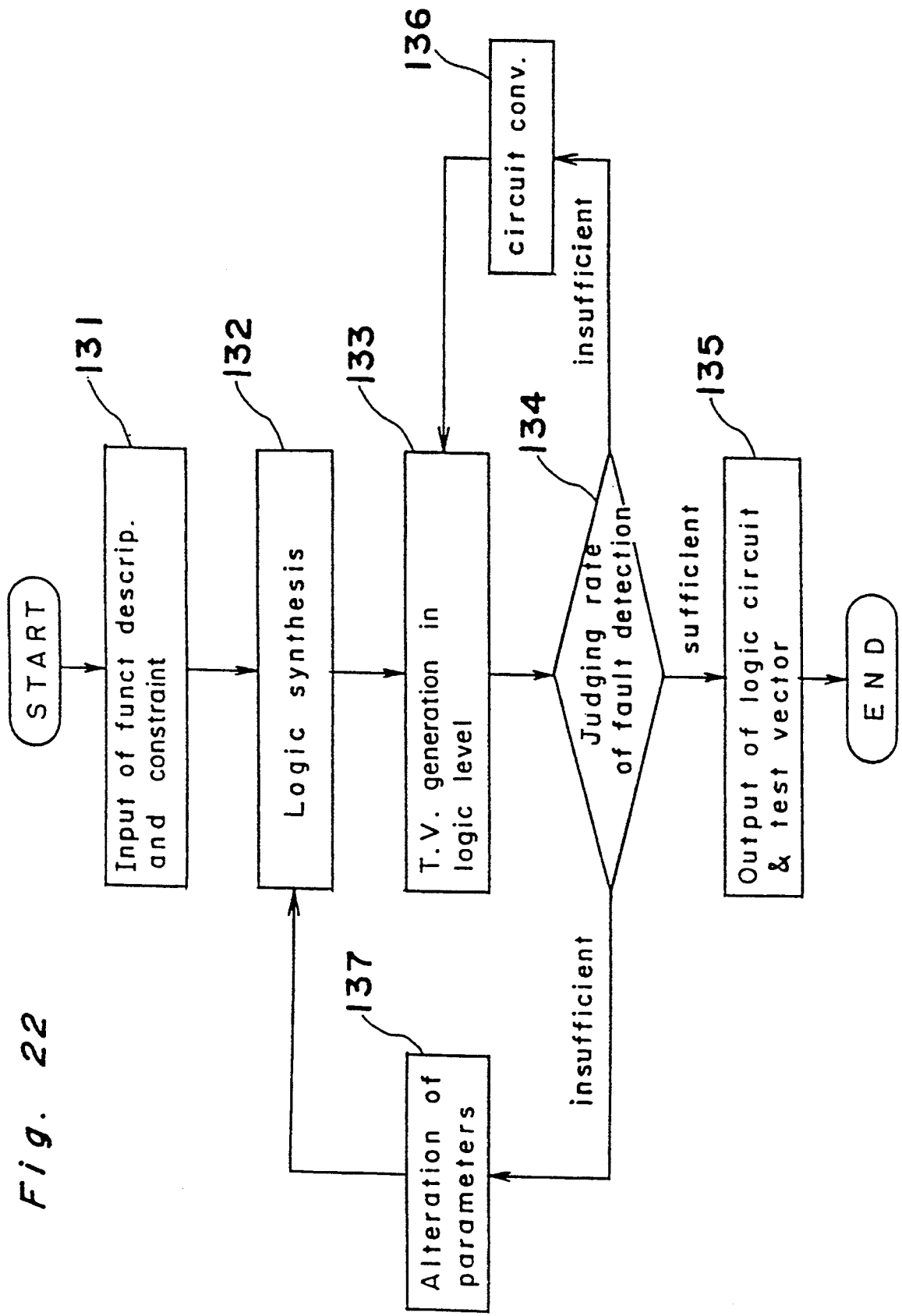
FIGS. 22, 23 and 24 are processing flowcharts of main routines to be executed by the logic circuit generators according to the first, second and third preferred embodiments of the present invention, respectively.

FIG. 22 shows a flow chart of the procedure according to the preferred embodiment mentioned just above.

The present embodiment of the invention is now described in more detail with regard to the processing thereof.

Figures 4, 6:
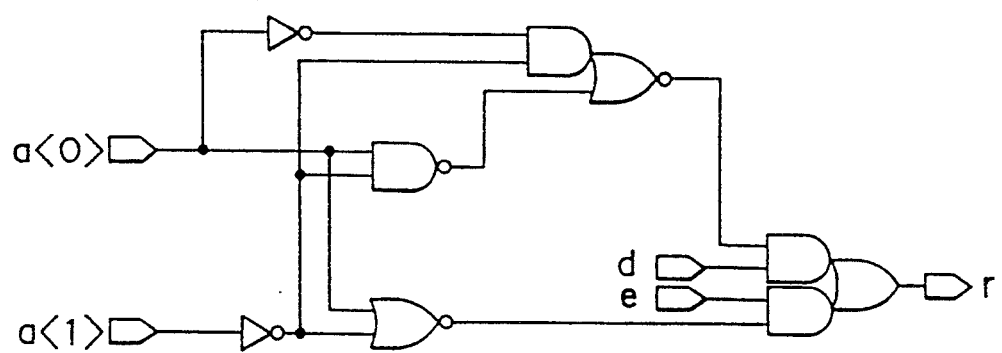
FIG. 4 is an example of the functional description.
FIG. 6 is a logic circuit synthesized by the logic circuit synthesizing means 1 according to the functional description indicated in FIG. 4.

FIG. 4 shows an example of the functional description using a hardware description language, which is an input for the logic circuit generator of the present embodiment. Using the hardware description language allows operation of logic circuits to be described using syntax of a software high-level language type. The exemplary description of FIG. 4 represents an operation of a circuit wherein if a 2-bit signal "a" is 0, 0 is substituted for a signal "r"; when "a" is 1, a value of a signal "d" is substituted for "r"; and when "a" is 2, a value of a signal "e" is substituted for "r".

Figure 5:
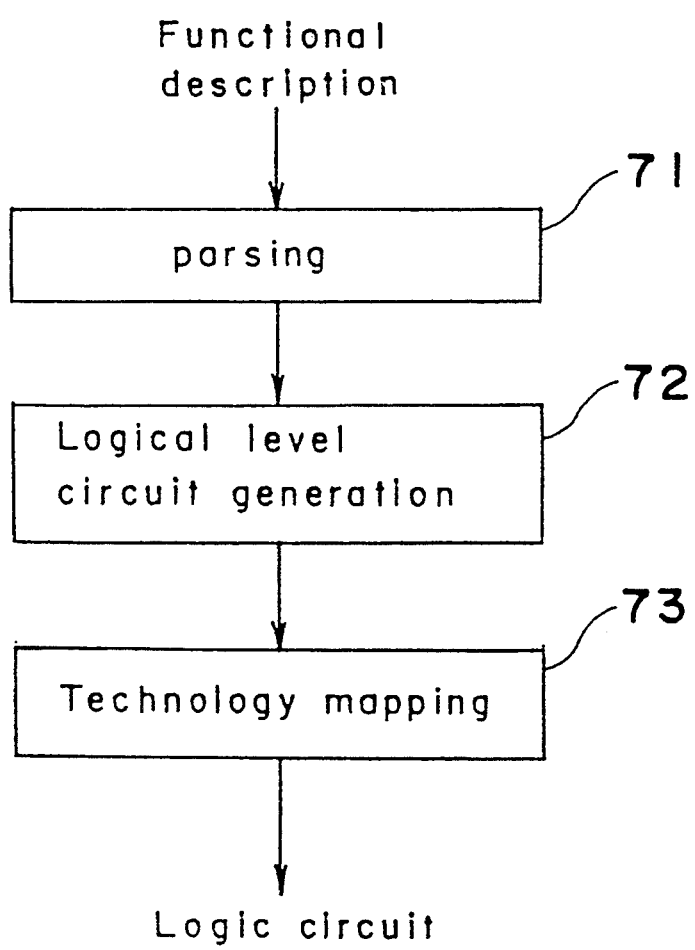
FIG. 5 is a processing flowchart to be executed by the logic circuit synthesizing means 1.

FIG. 5 shows a processing flowchart of the logic synthesizing means 1 in this embodiment. In the figure, reference numeral 71 denotes a syntactic analysis step for syntactically analyzing the functional description represented in the above language in order to convert it into an analytic tree corresponding to the description; 72 denotes a logic-level circuit generation step for generating an abstract logic-level circuit independent of technology from the resulting analytic tree; and 73 denotes a technology mapping step for converting the logic-level circuit into one that satisfies the restrictions required for a particular technology.

FIG. 6 shows a logic diagram representing a logic circuit generated by the logic synthesizing means 1 of the present embodiment, using the exemplary functional description of FIG. 4. The logic circuit is here represented by connecting cells included in a particular cell library to each other.

Although the functional description is considered as a hardware description language in the logic synthesizing means 1 of the present embodiment, other functional descriptions such as logic equations, truth tables, and functional drawings are also available.

The logic circuit synthesized by the logic synthesizing means 1 is then input into the logic-level test vector generating means 2 thereby to evaluate the fault detection rate.

To generate test vectors in a logic level, a degenerate fault is assumed on a logic circuit and input for the purposes of detecting its presence.

The logic-level test vector generating means 2 in the present embodiment employs an algorithm based on path activation. This method is used to determine a path that allows the difference between a signal value resulting from the assumed fault and a normal value in order to propagate the outputs of the circuit.

Figure 7:
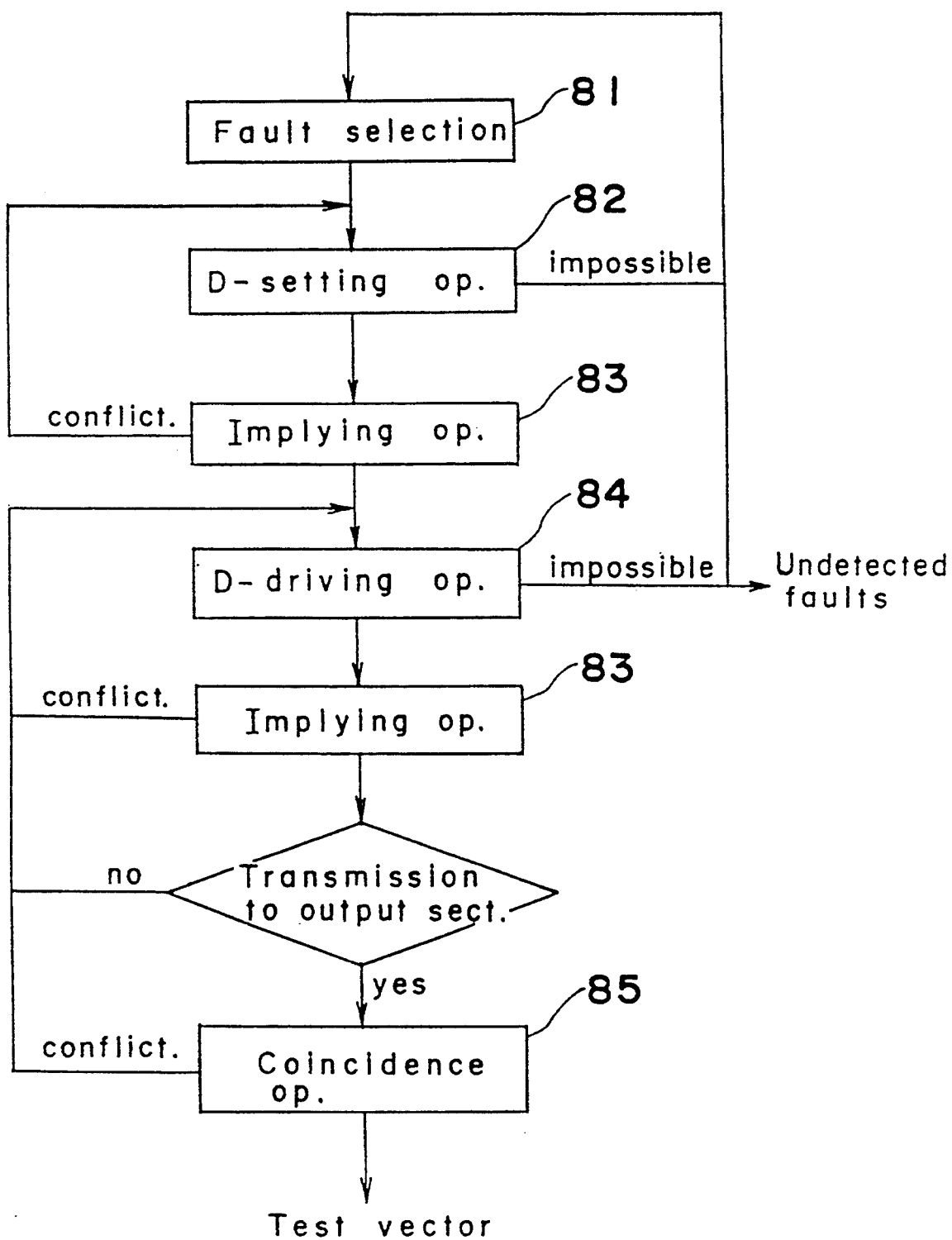
FIG. 7 is a processing flowchart to be executed by the logic level test vector generating means 2.

FIG. 7 shows a processing flowchart of the logic-level test vector generating means 2 in the present embodiment. In the figure, reference numeral 81 denotes a fault selection step for selecting one fault out of a fault set; 82 denotes a D setting operation step for setting a fault basic D cube to a selected fault and determining an input value which satisfies the cube; 83 denotes an implication operation step for determining a value of each signal line to be determined when a value of a certain signal line is determined; 84 denotes a D drive operation step for propagating the fault basic D cube in the direction of output; and 85 denotes a coincidence operation step for setting values on the input side so as not to be inconsistent with given values of the signal lines.

The fault basic D cube herein mentioned refers to respective states of a signal line indicating that the value differs depending on the presence or absence of any fault. In the present embodiment, this fault basic D cube is propagated to one of the outputs by repeating the D drive operation step 84 and the implication operation step 83, and thereafter an input pattern which realizes such propagation is determined by the coincidence operation step 85. The determined input pattern forms a test vector for a selected fault.

Figure 8:
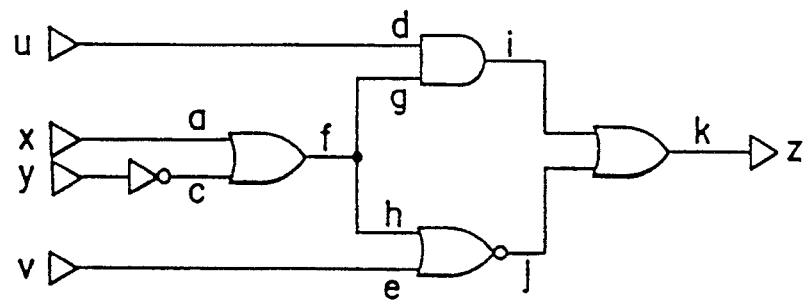
FIG. 8 is an example of the logic circuit to be tested.

For example, referring to a circuit as shown in FIG. 8, to detect a c/0 fault (i.e. a degenerate fault in which a signal line c is fixed to 0) an input which causes the signal line c to be 1 is necessary and, accordingly, an input y must be 0. If the state wherein the signal line c is 1 in the normal state and 0 for the faulty state is written as D, an input x is required to be 0 in order to cause a signal line f to be D. Then, in order to cause a signal line i to be D, an input u is required to be 1. Finally, in order to cause an output z to be D, a signal line j must be 0, and for this purpose, a remaining input v is required to be 1.

In consequence, it proves that when $x=y=0$ and $u=v=1$, z becomes D, and the output value is 1 in the normal state, while it is 0 for the c/0 fault case. This means that $x=y=0$ and $u=v=1$ leads to a test vector for the fault c/0.

Meanwhile, when any inconsistency arises at the implication operation step 83 or coincidence operation step 85, a back track takes place, followed by attempting another D drive or D setting. If all the attempts result in failure, or if the number of back tracks exceeds a set value, the test vector generation for the fault is terminated, it being considered as an undetected fault. The ratio of detectable faults to the total faults in the logic circuit generated is reported as a fault detection rate.

As the method of generating logic-level test vectors, various types of methods other than the one described above are possible and can be used in other embodiments of the present invention.

Since it is difficult in terms of processing time to conduct a test vector generation in a logic level using a pure algorithmic technique, fault simulation is in many cases employed in combination therewith. As a matter of course, the logic-level test vector generating means 2 includes such a mixed type of technique.

Figures 9, 10:
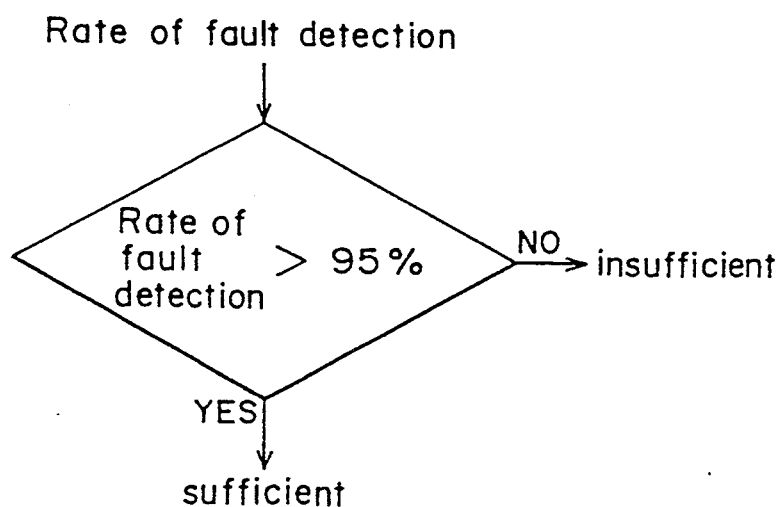
FIG. 9 is a table showing test vectors generated by the logic-level test vector generating means 2.
FIG. 10 is a processing flowchart to be executed by the judging means.

FIG. 9 shows an example of a list of test vectors generated by the logic-level test vector generating means 2 in the present embodiment.

Whereas a fault to which the test vector generation has resulted in failure is reported as an undetected fault, information concerning the processing in which the failure has actually occurred is simultaneously reported along therewith, the two being outputted as results of the testability analysis. Although in this embodiment an undetected fault list is transmitted to the circuit converting means 4 as a testability analysis result by the logic-level test vector generating means 2, it is not necessarily limited to the undetected fault list, but others also will do such as a list of difficult-to-observe points or that of difficult-to-control points.

The fault detection ratio evaluated by the logic-level test vector generating means 2 is fed to the judging means 3.

FIG. 10 shows a processing flowchart of the decision means 3 in this embodiment. In the present embodiment, the input fault detection rate is compared with a previously set threshold value (95% in this case); if it is larger than the threshold value, it is considered sufficient, while if smaller, it is to be insufficient.

Although a value of 95% is selected as the threshold value in this embodiment, it may be set to a discretionary value. In usual cases of LSI design, a fault detection rate of not less than 90% is required. The higher the threshold value, the higher the testability of a synthesized circuit; however, on the other hand, it is liable to be accompanied by increase in cost and delay. Further, use of a threshold value of 100% allows circuit conversion to be carried out at all times irrespective of any input fault detection rate, but this is virtually the case where no decision is made, which corresponds to the case where the judging means 3 is absent.

Moreover, although in the present embodiment only the fault detection rate is used to conduct a judgment, other information such as results of the testability analysis or cost and delay of a logic circuit or processing time may be used to conduct the judgment, which can be taken as another embodiment of the present invention.

If a fault detection rate is insufficient as a result of the decision of the judging means 3, the circuit converting means 4 renders a circuit conversion for enhancing the testability of the logic circuit synthesized by the logic synthesizing means 1, on the basis of results of the testability analysis outputted from the logic-level test vector generating means 2, thereby generating an easy-to-test logic circuit.

Figure 11:
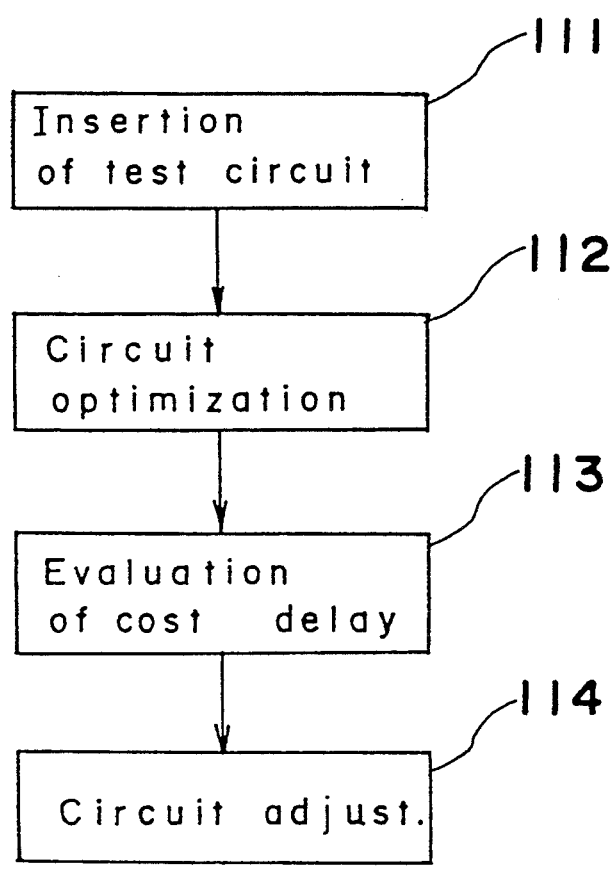
FIG. 11 is a processing flowchart to be executed by the circuit converting means 4.

FIG. 11 shows a processing flowchart of the circuit converting means 4 in the present embodiment. In the figure, reference numeral 111 denotes a test circuit insertion step for inserting a test circuit into an input logic circuit according to input results of the testability analysis; 112 denotes a circuit optimization step for rendering a circuit conversion to eliminate redundancy caused in the circuit as a result of the test circuit insertion; 113 denotes a cost/delay evaluation step for evaluating cost and delay of the circuit into which the test circuit is inserted to decide whether or not it satisfies given restrictions; 114 denotes a circuit adjustment step for converting the circuit so as to satisfy design restrictions when it is not satisfied as a result of the cost/delay evaluation step.

Figure 12A:
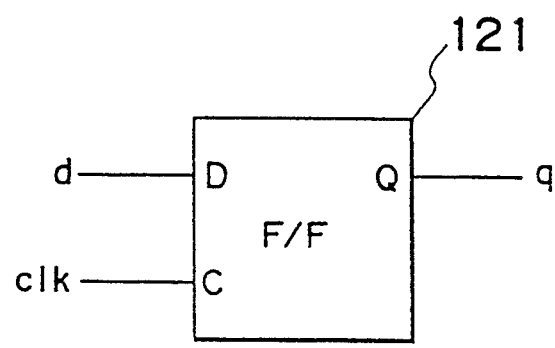
FIG. 12a and 12b are an example of the test circuit insertion.
Figure 12A:
Figure 12B:
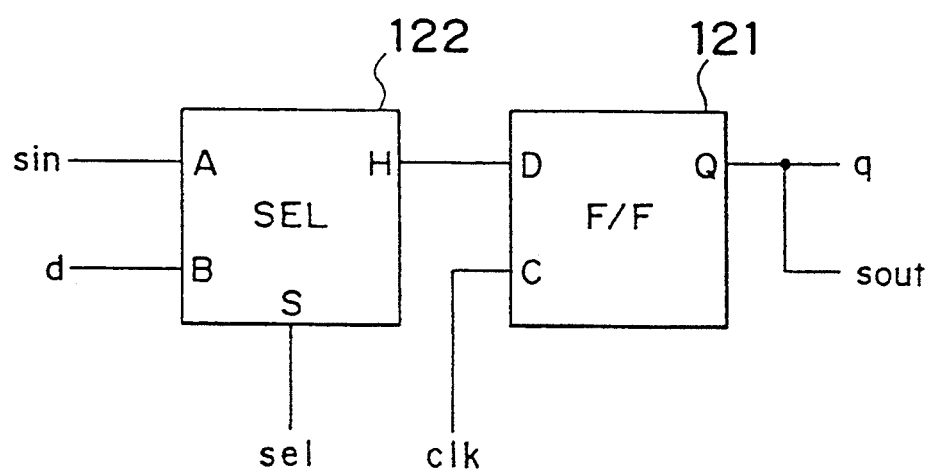

FIG. 12a and 12b show a circuit conversion involved in a scan-path insertion toward a flip-flop within the circuit, as an example of the test circuit insertion processing. Reference numeral 121 denotes a flip-flop which fetches and stores the value of a data input d in synchronization with the leading edge of each clock signal clk. According to the conversion, a select circuit 122 is inserted immediately before the flip-flop 121, so that the input for the flip-flop 121 is switched to either the original data input d or to scan input sin depending on a value of a select signal sel. The scan input sin is connected to an output Q of a preceding-stage flip-flop (not shown) that forms a scan path, thereby allowing the data input d for normal operation and the scan input sin for scan operation to be input into the flip-flop 121. In the scan operation, flip-flops forming a scan path serves like a shift register as a whole, permitting a value to be set to the flip-flops from external bit by bit in series.

As is clearly understood from the aforementioned, the insertion of a scan path allows values to be freely set to each flip-flop in a circuit and the value of each flip-flop to be freely read, thus facilitating the test of a sequential circuit, which is difficult as it is, up to a level of a combinational circuit.

Figure 13A:
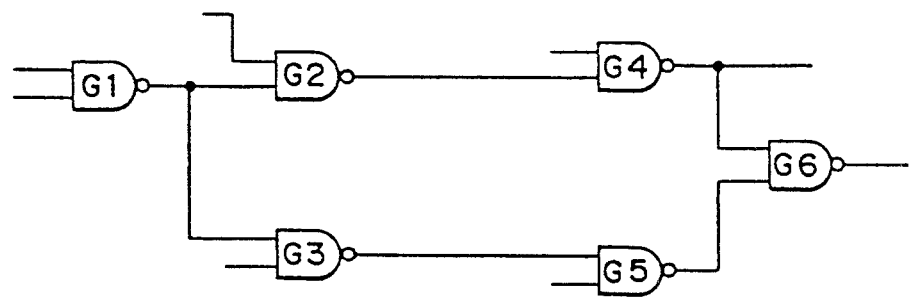
FIG. 13a and 13b are another example of the test circuit insertion.
Figure 13B:
Figure 13B:
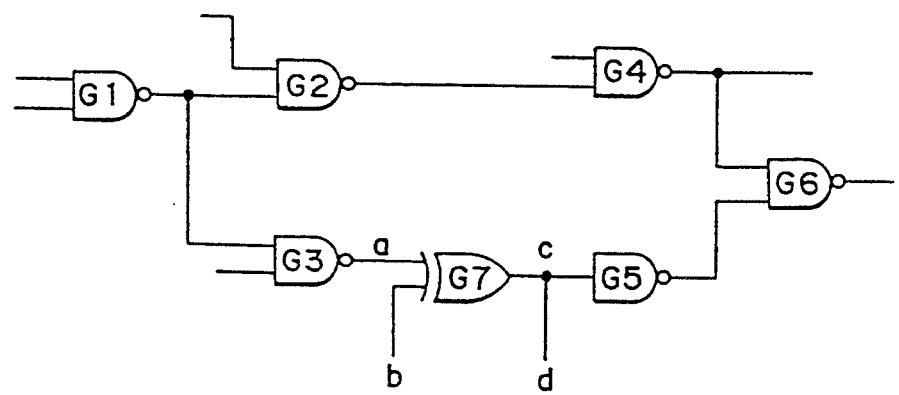

FIGS. 13a and 13b show a circuit conversion involved in the process of eliminating a reconvergence, as another example of test circuit insertion processing. The biggest difficulty in testing a combinational circuit is a reconvergence involved in the circuit. The reconvergence is the state in which a signal in the circuit serves as the input of the same gate by passing through a plurality of paths; in the case of FIG. 13a, the output of G1 passes through two paths of G1→G2→G4→G6 and G1→G3→G5→G6, reconverging at G6.

If any reconvergence is present in a circuit, there often arises inconsistency in the implication operation step 83 (FIG. 7) that follows the D setting operation step 82 or D drive operation step 84 in the logic-level test vector generation processing, possibly resulting in failure of the test vector generation.

Thus, if such a difficult-to-test reconvergence is present, an EXCLUSIVE-OR gate can be inserted into either of the paths constituting the reconvergence to cut off the same, so that it can be converted into a circuit substantially involving no reconvergence.

In the case of FIG. 13b, an EXCLUSIVE-OR gate G7 is inserted between G3 and G5, so that each time D is propagated to a, D can be propagated to d. Moreover, whether the value of a is 0 or 1, the value of c can be set to either 0 or 1 depending on properly determining the value of b. As a result, it is possible to readily generate test vectors without causing any back tracks during the logic-level test vector generation.

Figure 14A:
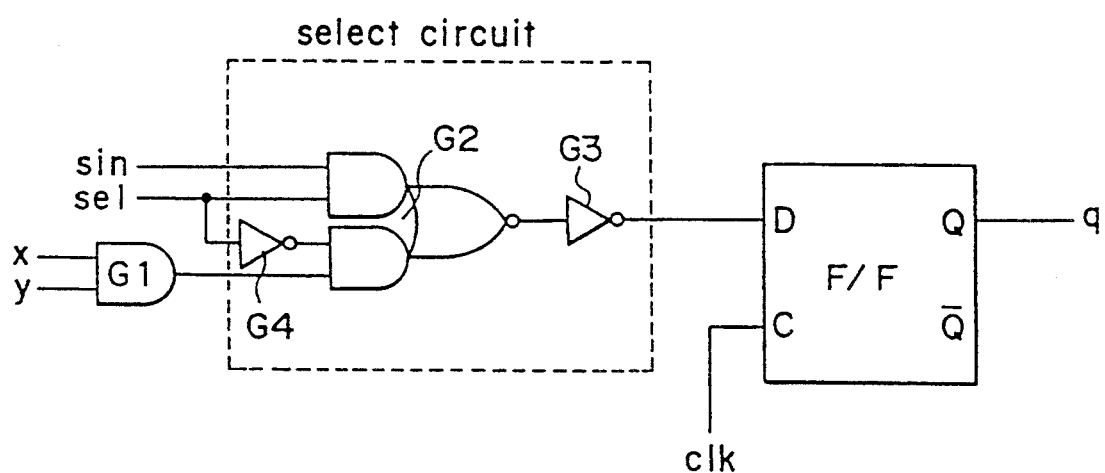
FIG. 14a and 14b are an example of the circuit optimizing processing.
Figure 14B:
Figure 14A:
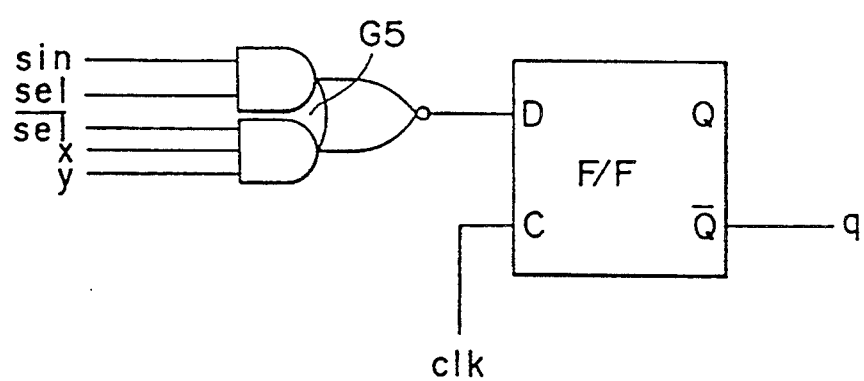
Figure 15A:
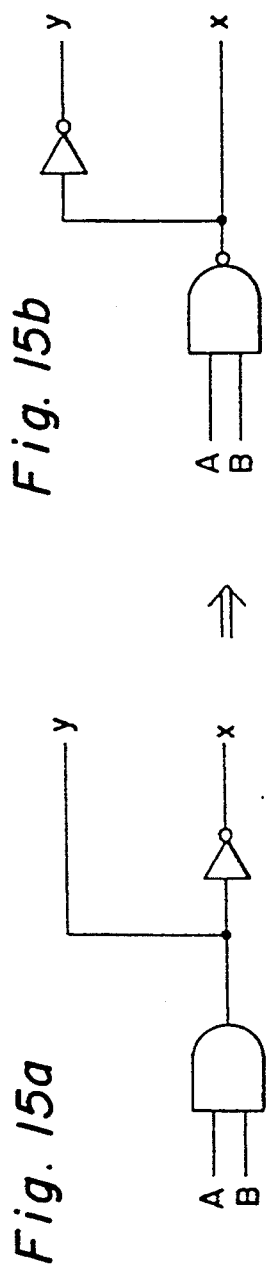
FIGS. 15a through 15f show examples of the circuit conversion used for contracting a delay.
Figure 15B:
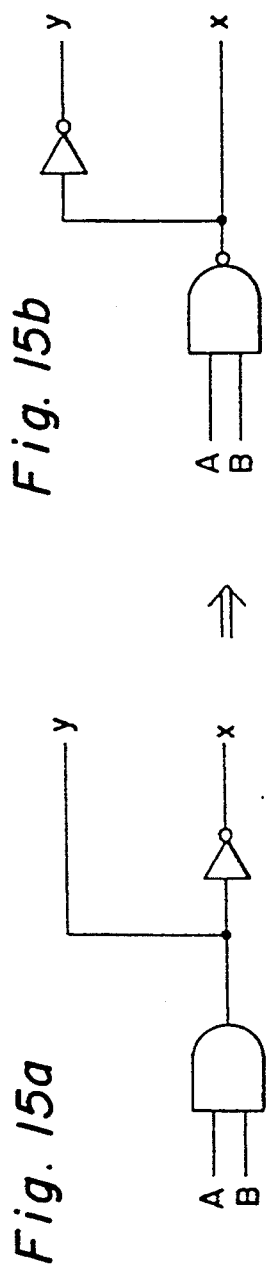
Figure 15C:
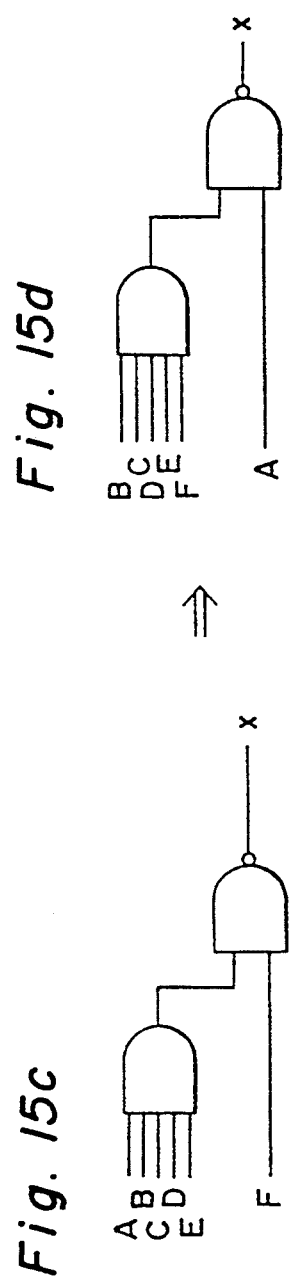
Figure 15D:
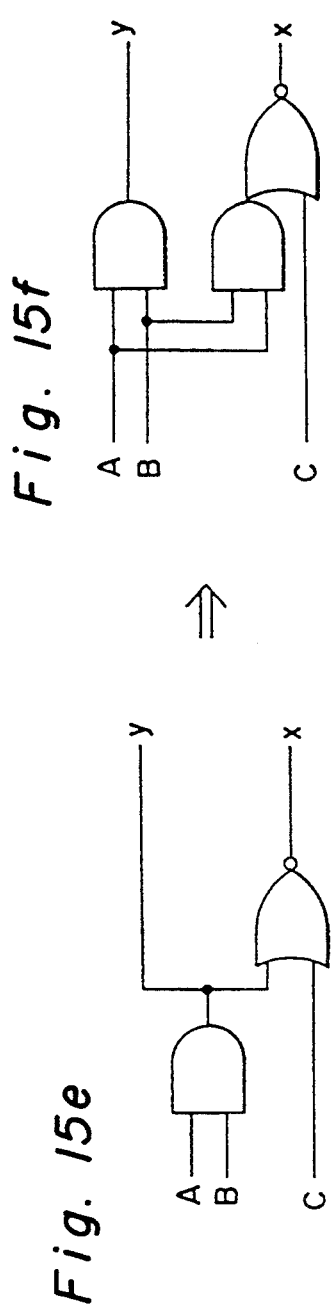
Figure 15E:
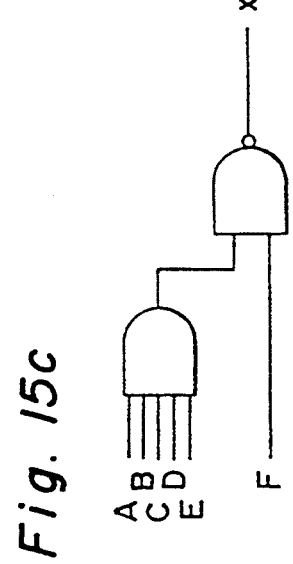
Figure 15F:
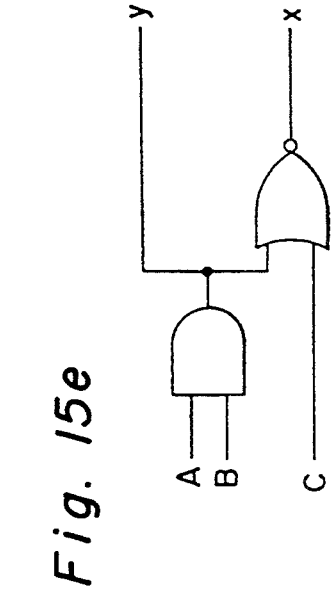

FIGS. 14a and 14b shows an example of a circuit optimization processing. In the test circuit insertion processing, a test circuit is inserted automatically, when necessary, without any regard to the peripheral circuitry. This causes in many cases the inserted test circuit and original circuit to be redundant. (In conventional logic circuit generators in which the testability is not taken into consideration, it has been impossible to eliminate the above-noted redundancies.)

Accordingly, in order to eliminate such redundancies, the circuit optimization processing is necessitated after the test circuit insertion processing.

FIG. 14a exemplifies the circuit optimization in the periphery of a flip-flop after the scan-path insertion processing. To the D input of the original flip-flop is connected an AND gate G1, in which a select circuit made up of a composite gate G2 and two inverters G3 and G4 is inserted by the scan-path insertion processing.

In the circuit resulting from the optimization, the AND gate G1 is absorbed into the composite gate G2, while the inverter G3 is absorbed into the flip-flop. Further, the inverter G4 is removed and a signal line sel having the same function is connected instead thereof. It can be understood that the circuit after the optimization is reduced in both area and delay, when compared with before.

However, it is apparent that even the circuit existing after the optimization is rendered is increased in both area and delay when compared with the original circuit before the test circuit insertion. Moreover, it is not ensured that the design restrictions on area and delay that the original circuit has satisfied are still satisfied.

Thus, after the circuit optimization is rendered, cost and delay of the circuit are evaluated to check whether design restrictions are satisfied. If it follows that they are not, it is necessary to conduct a circuit adjustment processing so as to satisfy the restrictions.

For example, since a select circuit is inserted immediately before a flip-flop along with the scan-path insertion, the delay of a D input of the flip-flop may increase such that the restriction for set-up time (i.e. the restriction that the D input must be established a certain time period before the clock signal changes) will not be satisfied, possibly requiring the delay of the D input to be reduced.

FIGS. 15a through 15f show an example of a circuit conversion commonly used to reduce the delay. In each case, a delay between input A and output X are reduced. In the case shown by FIGS. 15a and 15b, output polarity of a gate is changed thereby to eliminate the inverter existing in the path. In the case shown by FIGS. 15c and 15d, signals A and F, which are logically equivalent to each other, are exchanged thereby to reduce the number of gate stages in the path. In the case shown by FIGS. 15e and 15f, gates are doubled to form up a composite gate.

In addition, although the circuit converting means in this embodiment carries out the sequence from the test circuit insertion processing to the circuit adjustment processing, it is not necessarily limited thereto; for example, this may be substituted by the method in which cost and delay are evaluated to insert a test circuit or conduct the circuit optimization within the scope satisfying the restrictions, which can be taken as another embodiment of the present invention.

Moreover, although the circuit converting means in this embodiment takes into account only cost and delay of the circuit as design restrictions, it may be the case that power consumption and the like are also necessarily taken into consideration, which can be taken as another embodiment of the present invention.

Furthermore, although the circuit converting means in this embodiment involves scan-path insertion and reconvergence elimination as examples of the test circuit insertion processing, other measures are also possible such as addition of reset function to flip-flops, addition of control-observation I/O ports for difficult-to-control-observe points, and addition of scan flip-flops.

As described above, in the present invention, the testability of a logic circuit is evaluated in the logic level by the logic-level test vector generating means 2; if any insufficient point proves to be present as a result thereof, it is converted in the logic level by the circuit converting means 4 so as to make it easy to test.

This makes the testability analysis more accurate when compared with the conventional method, and the circuit conversion for test facilitation is rendered only to points actually required, thus minimizing the increase in cost involved in the test facilitation. In the conventional logic circuit generator in which the testability is taken into consideration, test circuits may be inserted into even unnecessary points or, in turn, not inserted into necessary points. This is the critically significant improvement of the present invention.

Figure 2:
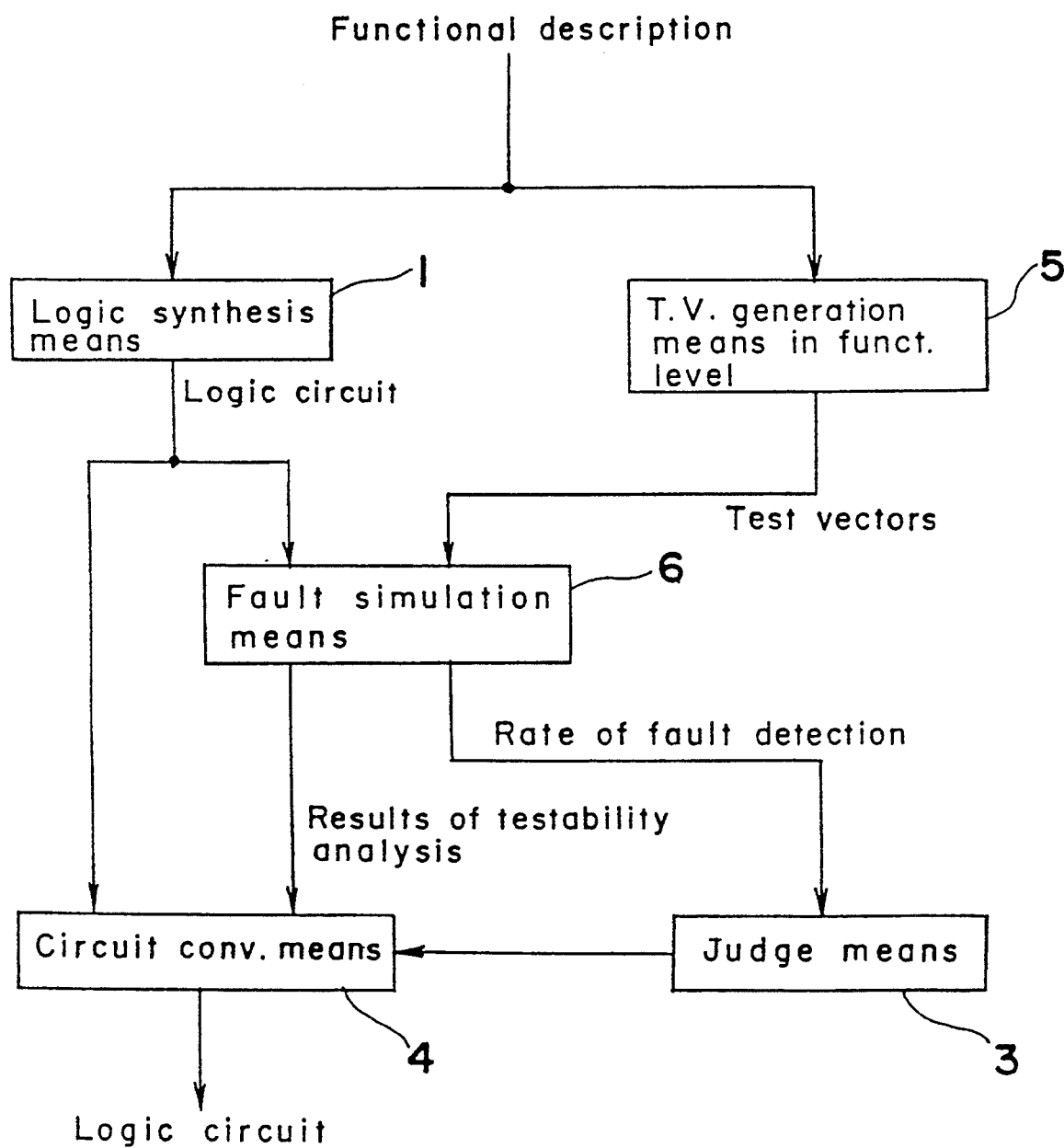
FIG. 2 is a block diagram showing the construction of an embodiment of the logic circuit generator according to claim 2 of the present invention.

FIG. 2 is a block diagram showing the construction of the second preferred embodiment of the logic circuit generator according to claim 2 of the present invention. In the figure, reference numeral 1 denotes a logic circuit generator for synthesizing a logic circuit that implements a given function according to an input functional description; 5 denotes a function-level test vector generating means for generating a test vector for use in a fault detection from the input functional description; 6 denotes a fault simulating means for performing a fault simulation to the logic circuit synthesized by the logic synthesizing means 1, using the test vector generated by the function-level test vector generating means 5, and further outputting a fault detection rate of the test vector and a list of undetected faults; 3 denotes a judging means for deciding whether or not the fault detection rate outputted from the fault simulating means 6 is sufficiently high; and 4 denotes a circuit converting means for, when it is decided by the judging means 3 that the fault detection rate is insufficient, converting the logic circuit synthesized by the logic synthesizing means 1 according to the list of undetected faults outputted from the logic-level test vector generating means 2.

The embodiment of the present invention constructed as above is described below with regard to the operation thereof.

First, a logic circuit synthesized by the logic synthesizing means 1 from the input functional description is subjected to a fault simulation using the test vector generated by the function-level test vector generating means 5 from the input functional description thereby to evaluate a fault detection rate.

Then, the decision means 3 decides whether or not the fault detection rate is sufficiently high; if it is, the logic circuit synthesized by the logic synthesizing means 1 is outputted as it is, along with the test vector generated by the function-level test vector generating means 5.

If the fault detection rate is insufficient as a result of the judgment by the judging means 3, the circuit converting means 4 renders circuit conversion for enhancing the testability of the logic circuit synthesized by the logic synthesizing means 1 according to the list of undetected faults outputted from the fault simulating means 6, thereby generating an easy-to-test logic circuit.

Further, if it becomes impossible to satisfy the design restrictions as the result of the circuit conversion, parameters related to the logic synthesis are altered and the process returns to the logic synthesizing means 1 again to synthesize a logic circuit using the new altered parameters altered.

Figure 23:
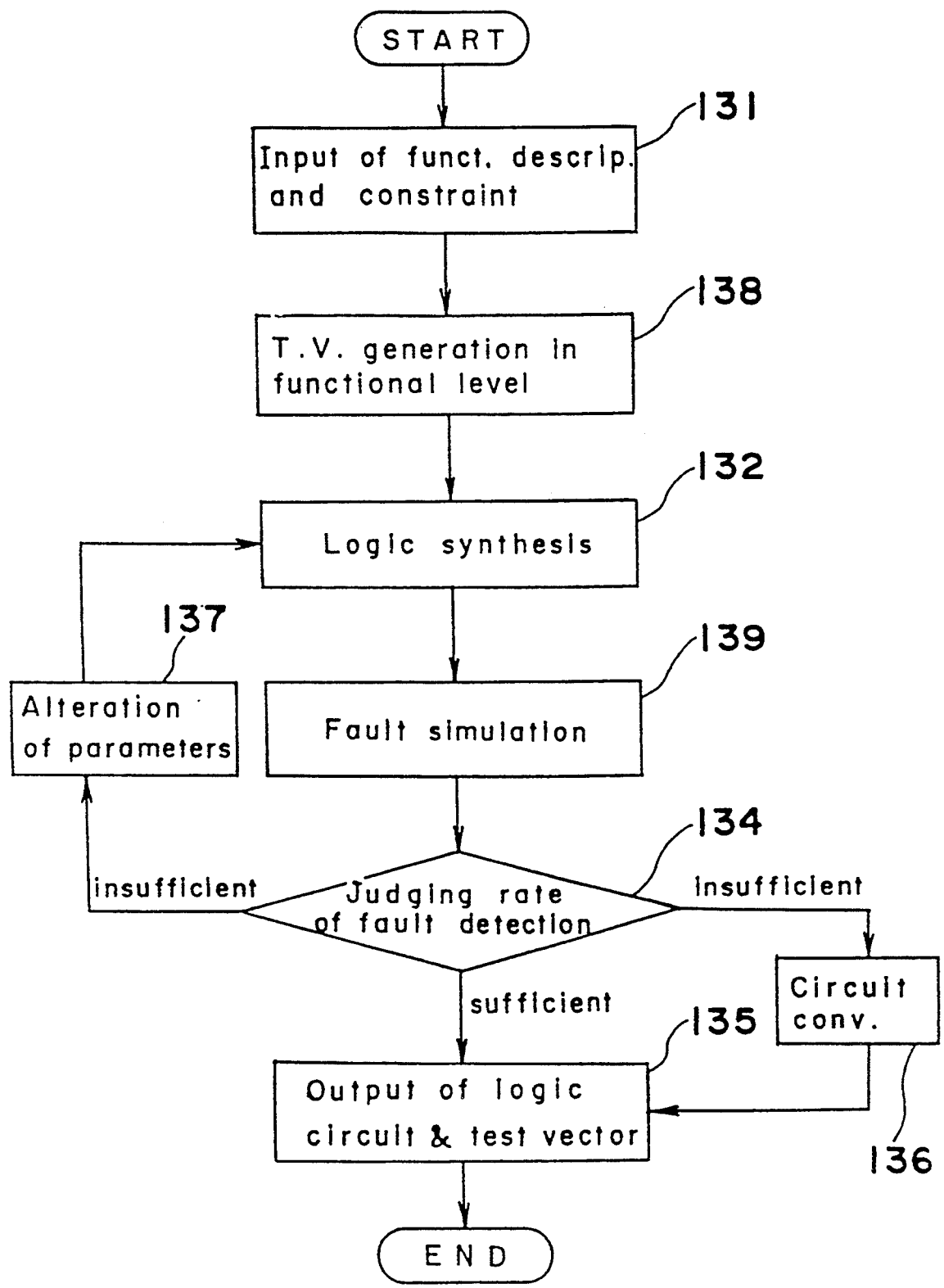

FIG. 23 shows a processing flowchart according to the second preferred embodiment of the present invention.

The present embodiment of the invention is now described in more detail with regard to the processing thereof, in which the logic synthesizing means 1, the decision means 3, and the circuit converting means 4 are the same as in the first preferred embodiment, and therefore detailed description thereof is omitted.

In the function-level test vector generation, a predetermined fault is assumed in a function-level circuit or functional description input values, so as to be able to detect the fault.

The function-level test vector generating means 5 in the present embodiment is one in which the test vector generation, in which conventionally is manually performed by circuit designers, has been realized on a computer. In this technique, experiential knowledge of an individual designer takes an important role.

Figure 16:
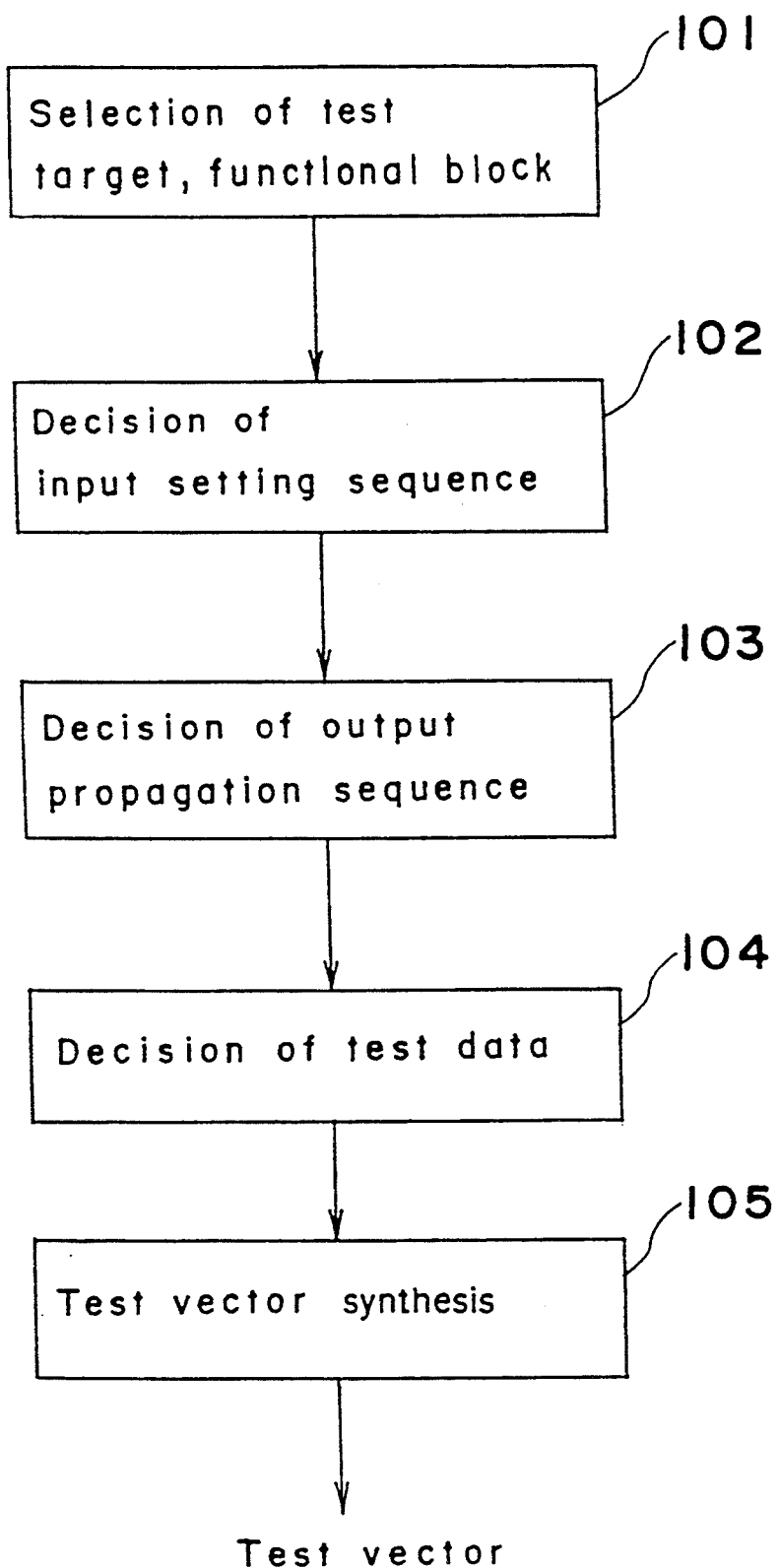
FIG. 16 is a processing flowchart to be executed by the functional-level test vector generating means 5 of the second preferred embodiment.
Figure 19:
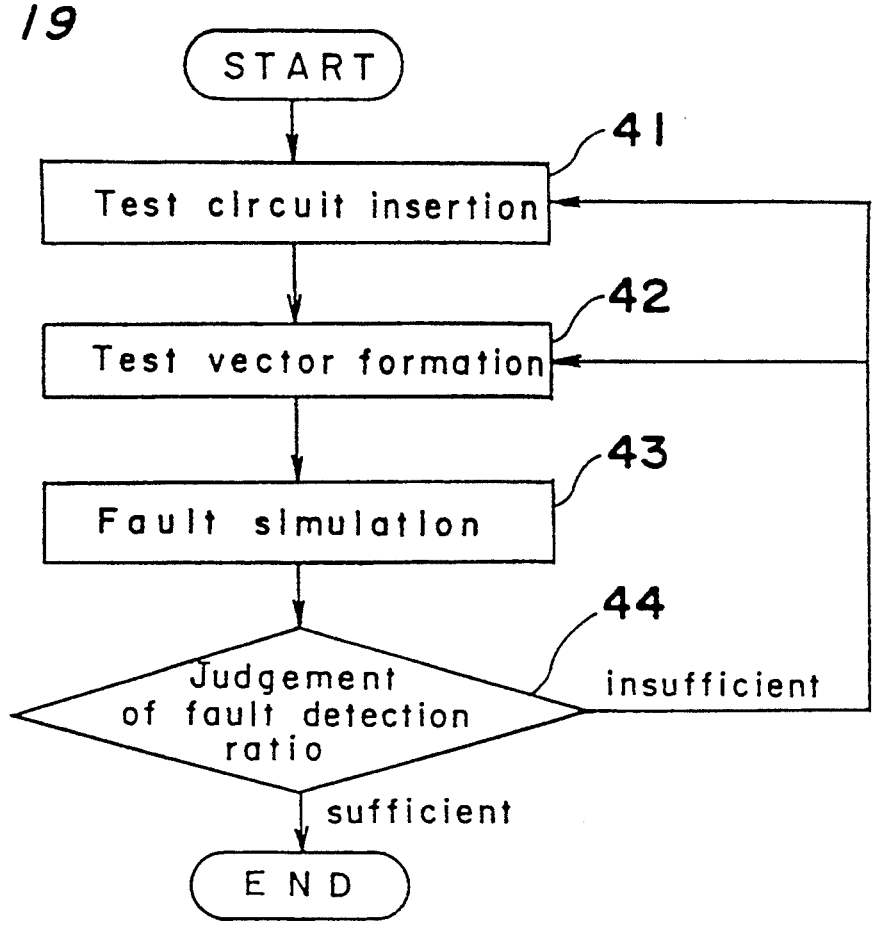
FIG. 19 is a processing flowchart of a typical conventional test design method.
Figure 20:
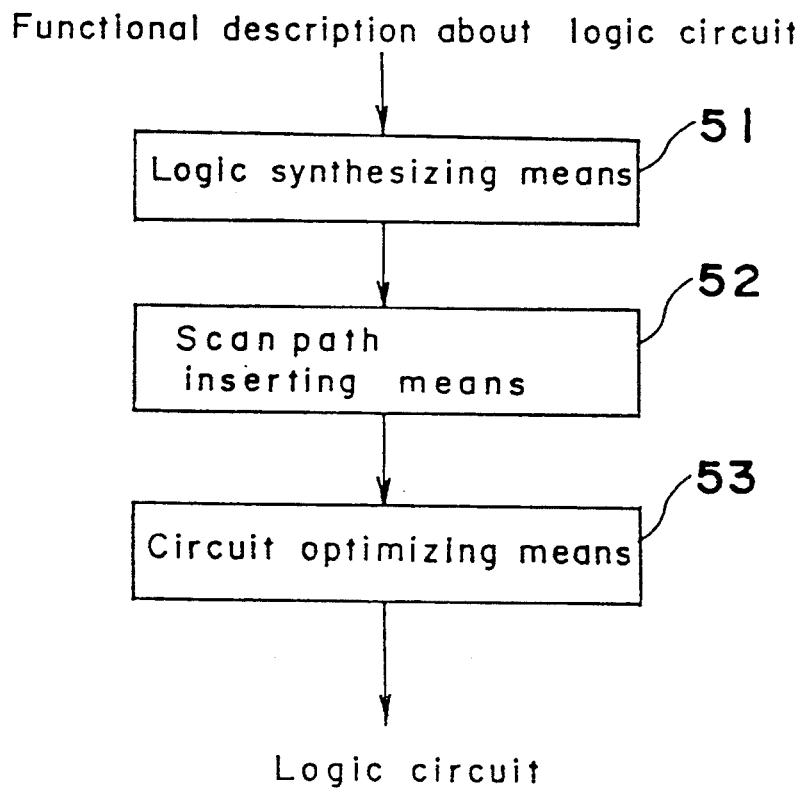
FIG. 20 is a processing flowchart of a typical conventional logic circuit generating method taking the testability thereof into consideration.
Figure 21:
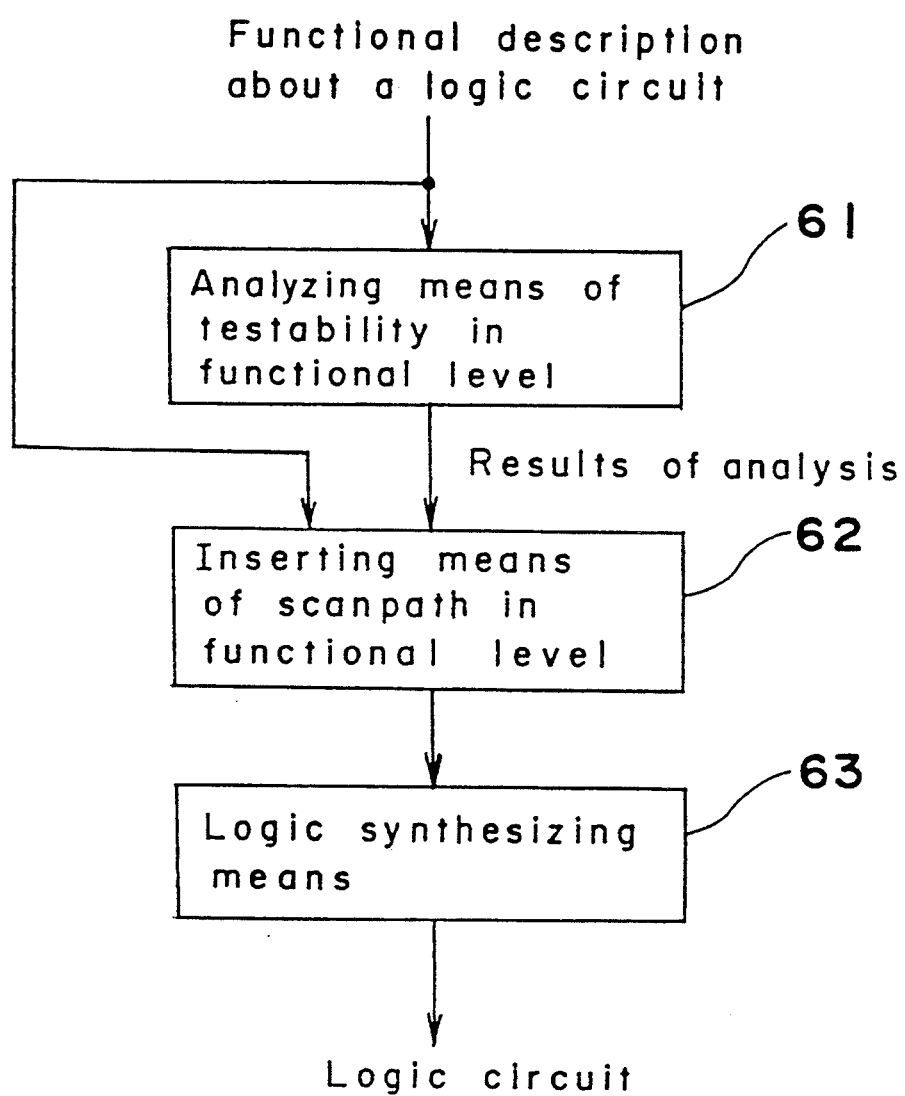
FIG. 21 is a processing flowchart of another logic circuit generating method taking the testability thereof into consideration.

FIG. 16 shows a processing flowchart of the function-level test vector generating means 5 in this embodiment. In the figure, reference numeral 101 denotes an under-test functional block selection step for selecting a functional block to be tested (i.e. components of the function-level circuit such as adders and registers) out of the function-level circuit; 102 denotes an input setting sequence decision step for deciding a procedure to set input data for the above-noted functional block by propagating a signal from external inputs of the circuit to the input of the selected functional block; 103 denotes an output propagating sequence decision step for deciding a procedure to feed output data of the functional block to the external outputs by propagating signals from the output of the functional block to the external output of the circuit; 104 denotes a test data decision step for deciding a set of combinations of input data of the functional block necessary to obtain a sufficiently high fault detection rate; and 105 denotes a test vector synthesis step for synthesizing a set of test vectors as inputs of the circuit from a set of combinations of the decided test sequence (input setting sequence and output propagating sequence) and a set of test data.

Figure 17:
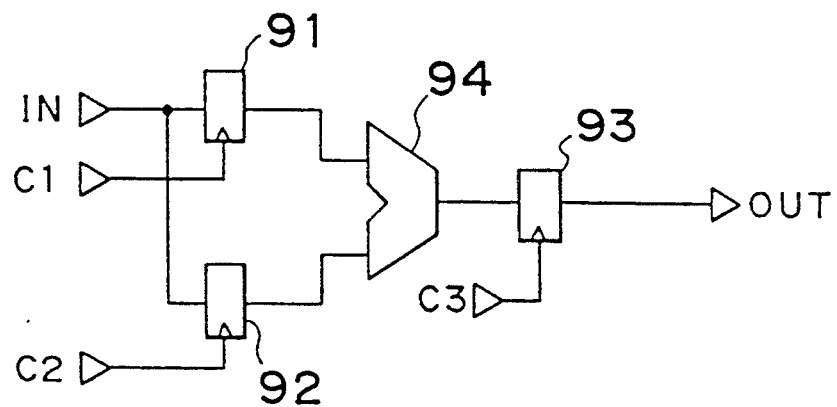
FIG. 17 is an example of a circuit represented in a functional level.

Such a function-level circuit as shogun in FIG. 17 is now considered as an example, where reference numerals 91, 92, and 93 denote registers and 94 an adder.

Assuming the adder 94 to be a functional block to be tested, test data are necessarily propagated to the inputs of the adder 94 from external inputs in order to test the functional block. In this case, the inputs of the adder 94 are connected to the registers 91 and 92, both of which are connected to a common external input IN. Accordingly, to propagate test data to the input of the adder 94, it is necessary to first set one of the test data to the external IN, thereby writing it into the register 91 at the timing of a clock C1, and then set the other of the test data to the external input IN, thereby writing it into the register 92 at the timing of the next clock C2.

When the test data has been propagated to the input of the adder 94, the calculation result is necessarily propagated to the external output. In this case, the output of the adder 94 is connected to the external output OUT via the register 93. Accordingly, to propagate a calculated result to the external output, it is necessary to write the same into the register 93 at the timing of the next clock C3.

Thus, the adder 94 can be tested by comparing the calculated result appearing at the external output with a proper expected value. To conduct highly reliable tests, it is required to conduct tests with a still larger amount of data and repeat the afore-noted test sequence with various input data, where selection of test data greatly affects the reliability of tests.

When the bit width of the input of the functional block is relatively small, all the data representable in the bit width can be test data, thereby giving the tests a high reliability. For example, if the bit width of the adder 94 is 3, data representable in 3 bits are 8 combinations from 0 to 7; the combinations of two inputs fall in the total $8 \times 8 = 64$ combinations. However, since the number of the combinations exponentially depend on the bit width, any larger width of data will make it impossible to test all the data. In such a case, any other method such as the use of random numbers is necessarily used to determine a practicable set of test data.

When the test sequence and test data are determined through the above-described steps, a test vector is determined which realizes the test sequence for each test data, and collecting such test vectors allows a test vector for the adder 94 to be determined. By repeating the above-described processing for all the functional blocks included in the circuit and further collecting the obtained test vectors, a complete set of test vectors for the afore-mentioned circuit can be obtained.

Although in this embodiment such a technique is used that the test sequence and test data are determined with respect to a single functional block in the circuit, a technique in which a plurality of functional blocks are taken into consideration at one time may also be applicable, which can be taken as another embodiment of the present invention. Referring to the circuit of FIG. 17, a test for the adder 94 also serves as tests for the registers 91, 92, and 93, thus making it unnecessary to further generate test vectors for the registers.

The test vectors generated by the function-level test vector generating means 5 as above are not accompanied by the evaluation of the fault detection rate in a logic level, thus requiring the fault detection rate to be evaluated by the fault simulating means 6.

In the fault simulation, faults that can be detected using a given test vector are determined in the reverse manner to the test vector generation in which test vectors for detecting presumed faults are determined. That is, if the result of normal logic simulation with input of a test vector differs from that of simulation with an assumed fault, it is assumed that the fault is detectable by the input test vector.

Figure 18:
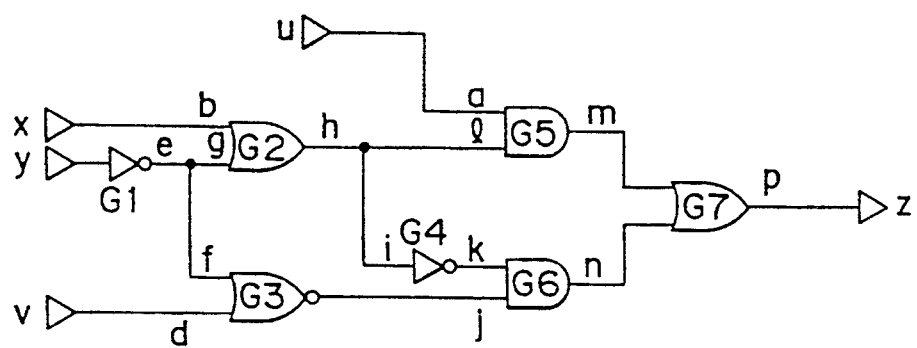
FIG. 18 is an example of a circuit to which a fault simulation is executed.

Such a circuit as shown in FIG. 18 is taken as an example, where the normal output value z resulting from a test vector $(u, v, x, y) = (1, 0, 0, 1)$ is 1. Now if a fault J/0 is assumed, n turns to 0, thus the output turning from 1 to 0. As a result, the j/0 fault is detectable by the above test vector.

On the other hand, if a fault h/1 is assumed, m turns to 1, k to 0 and n to 0, thus the output is unchanged, remaining as 1. As a result, the h/1 fault is undetectable by the above test vector.

The fault simulation of the present embodiment is carried out in the following steps. First, one test vector is selected to conduct a logic simulation, thereby determining the values of all the signal lines in the circuit. For example, for a test vector $(u, v, x, y) = (1, 0, 0, 1)$, internal signal lines are determined as $(a, b, c, d, e, f, g, h, i, J, k, 1, m, n, p) = (1, 0, 1, 0, 0, 0, 0, 0, 0, 1, 1, 0, 0, 1, 0, 1, 1)$, thus showing output value z to be 1.

Next, the set of detectable faults is propagated toward the side of the output starting with the gates connected to external inputs one by one. Detectable faults can be obtained, referring to one gate, by selecting such faults that make the output value of the gate change into a reverse state to normal, i.e. detectable faults, among such faults that make the signal value of the gate change into a reverse state to normal.

For example, referring to an AND gate G5, one input a is 1, the other input 1 is 0, thus the output thereof m being 0. Accordingly, the potential detectable faults are a/0, 1/1, and m/1. Out of these faults, 1/1 and m/1 cause the output m to turn from 0 to 1, while a/0 causes m to be held at 0. Thus, the resulting detectable faults are 1/1 and m/1.

These detectable faults are propagated to a gate G7 connected to the output of gate G5, included in the potential detectable faults of gate G7. The gate G7 checks detectability of those faults resulting from adding its own I/O faults to the propagated faults.

The faults propagated finally to the output z as above form a set of detectable faults for the test vector $(u, v, x, y) = (1, 0, 0, 1)$.

Such faults that are not included in the set of detectable faults obtained for all given test vectors are undetected faults. Also, the ratio of detectable faults to all the faults is reported as a fault detection rate.

In addition, various types of methods for fault simulation are possible other than those shown in the present embodiment, which can be used as other embodiments of the present invention.

As shown above, according to the present invention, the testability of a logic circuit is evaluated in the logic level by the function-level test vector generating means 5 and the fault simulating means 6, and as a result thereof, if there are any points insufficient in the testability, the circuit is converted in the logic level by the circuit converting means 4 so as to make it easy to test.

This makes the testability analysis more accurate when compared with the conventional method, and circuit conversion for test facilitation is rendered only to points actually required, thus minimizing the increase in circuit cost involved in test facilitation, as in the case of the invention claimed in claim 1.

Moreover, the testability analysis using the combination of the function-level test vector generation and the fault simulation has an advantage that a higher-speed processing is possible for circuits of larger scales when compared with the algorithmic technique of the logic-level test vector generation, which is a greatly important point of the present preferred embodiment.

Further, although a list of undetected faults is transferred to the circuit converting means 4 as a result of the testability analysis by the fault simulating means 6 in this embodiment, it is not necessarily limited to the list of undetected faults, but may be replaced with a list of difficult-to-observe points or difficult-to-control points or the like.

Figure 3:
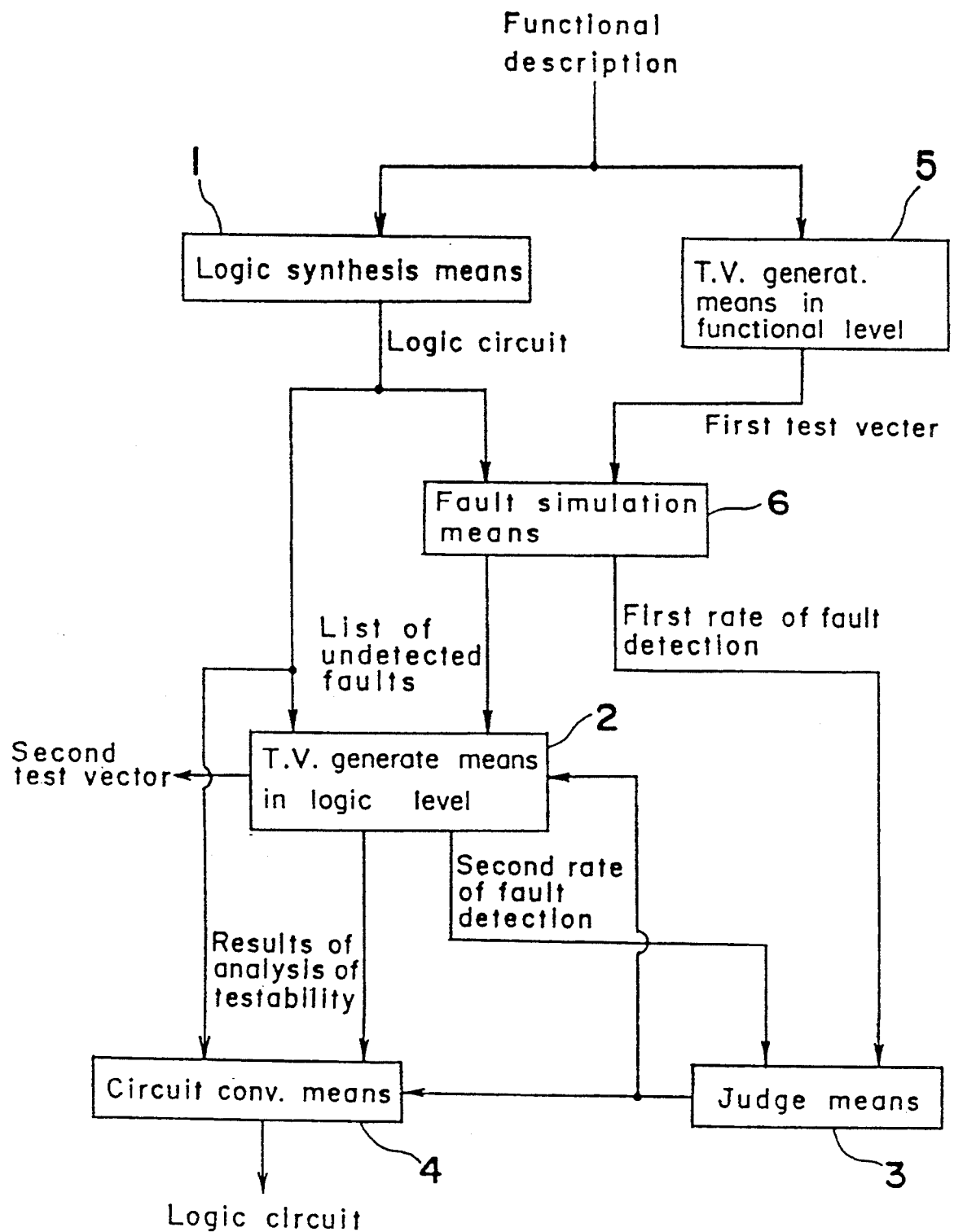
FIG. 3 is a block diagram showing the construction of an embodiment of the logic circuit generator according to claim 3 of the present invention.

FIG. 3 is a block diagram showing the construction of the third embodiment of the logic circuit generator according to claim 3 of the present invention. In the figure, reference numeral 1 denotes a logic circuit generator for synthesizing a logic circuit that implements a given function according to an input functional description; 5 denotes a function-level test vector generating means for generating test vectors for use in the fault detection of an input functional description; 6 denotes a fault simulating means for performing a fault simulation to the logic circuit synthesized by the logic synthesizing means 1, using the test vector generated by the function-level test vector generating means 5, and further for outputting a fault detection rate and a list of undetected faults regarding the test vector; 3 denotes a judging means for deciding whether or not the fault detection rate outputted from the fault simulating means 6 is sufficiently high; and 4 denotes a circuit converting means for, when it is judged by the judging means 3 that the fault detection rate is insufficient, converting the logic circuit synthesized by the logic synthesizing means 1 according to the list of undetected faults outputted from the logic-level test vector generating means 2.

The embodiment of the present invention constructed as above is described below with regard to the operation thereof.

First, a logic circuit synthesized by the logic synthesizing means 1 from an input functional description is subjected to a fault simulation using a first test vector generated by the function-level test vector generating means 5, from the input functional description, so as to evaluate a first fault detection rate.

Then, the judging means 3 decides whether or not the first fault detection rate is sufficiently high; if it is, the logic circuit synthesized by the logic synthesizing means 1 is outputted as it is, along with a test vector generated by the function-level test vector generating means 5.

If the first fault detection rate is insufficient, the logic-level test vector generating means 2 analyzes the logic circuit synthesized by the logic synthesizing means 1 according to a first list of undetected faults outputted from the fault simulating means 6, in order to generate a second test vector that complements the first test vector, and further to evaluate a second fault detection rate resulting from combining the first and the second test vectors.

The judging means 3 determines whether or not the second fault detection rate is sufficiently high; if it is, the logic circuit synthesized by the logic synthesizing means 1 is outputted as it is, along with the first and second test vectors.

If the fault detection rate is insufficient, the circuit converting means 4 renders a circuit conversion for enhancing the testability of the logic circuit synthesized by the logic synthesizing means 1 according to a second list of undetected faults outputted from the logic-level test vector generating means 2, thereby generating an easy-to-test logic circuit.

The easy-to-test logic circuit is again analyzed by the logic-level test vector generating means 2 to evaluate a fault detection rate of the test vector generated.

This process is repeated until a sufficiently high fault detection rate is obtained or the number of evaluations exceeds a predetermined maximum value.

Further, if it becomes impossible to satisfy given design restrictions as a result of the circuit conversion, parameters related to the logic synthesis are altered and the process returns to the logic synthesizing means 1 to synthesize a logic circuit using new parameters.

Figure 24:
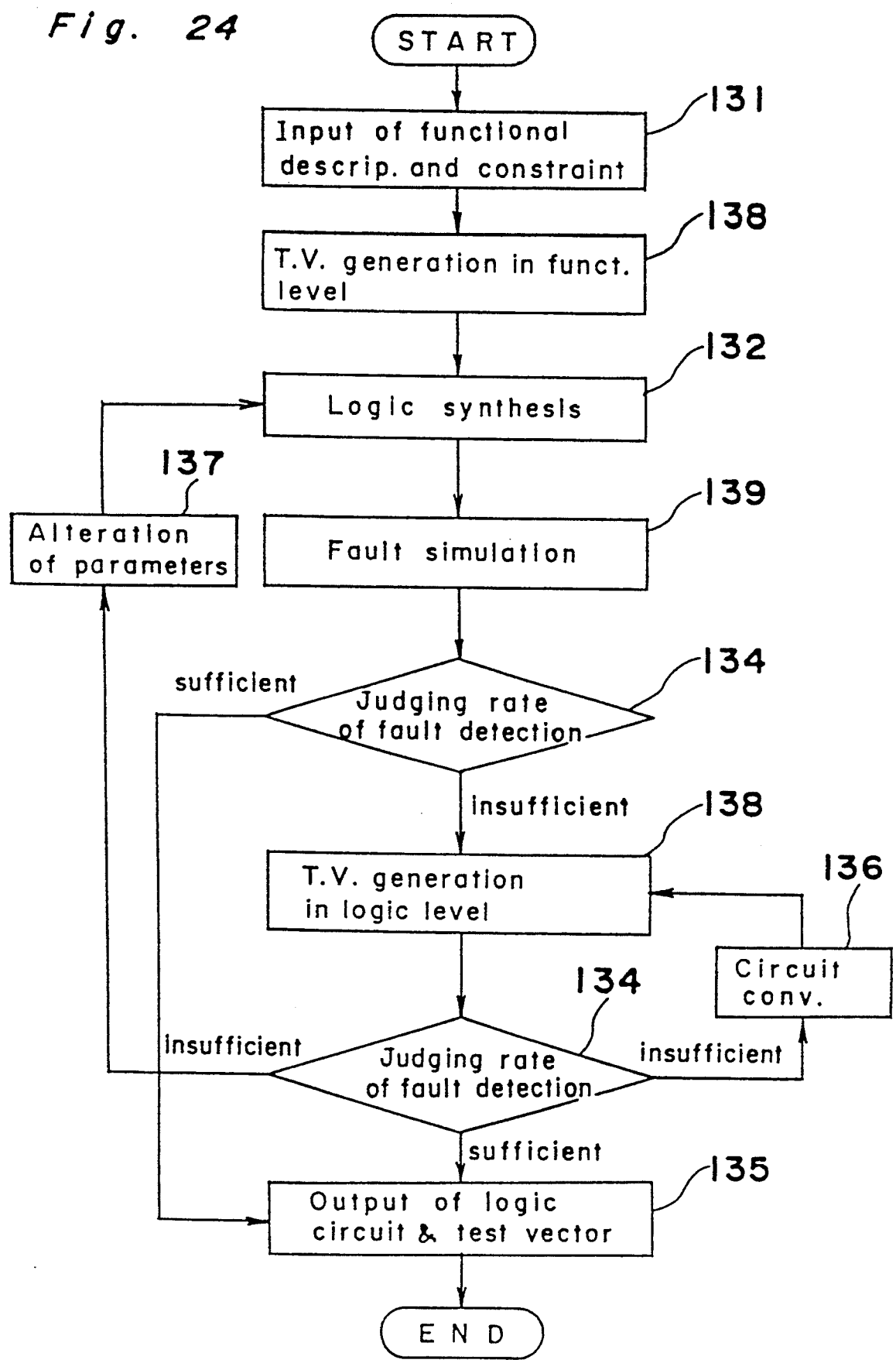

FIG. 24 shows a processing flowchart of the present preferred embodiment.

In this case, the logic synthesizing means 1, logic-level test vector generating means 2, judging means 3, and circuit converting means 4 are the same as in the first embodiment, and the function-level test vector generating means 5 and fault simulating means 6 are the same as in the second embodiment, Thus, detailed description thereof is omitted.

As shown above, according to the present invention, an approximate testability of a logic circuit is evaluated by the function-level test vector generating means 5 and the fault simulating means 6, then a more accurate testability of the logic circuit is evaluated by the logic-level test vector generating means 2, and as a result thereof, if there are any points insufficient in the testability, the circuit is converted in a logic level by the circuit converting means 4 so as to make it easy to test.

This makes the testability analysis more accurate when compared with the conventional method, and circuit conversion for test facilitation is rendered only to points actually required, thus minimizing the increase in circuit cost involved in test facilitation, as in the case of claim 1.

Moreover, the testability analysis using the combination of the function-level test vector generation and fault simulation has an advantage that a higher-speed processing is possible for circuits of larger scales when compared with the algorithmic technique of the logic-level test vector generation, as in the case of claim 2 of the present invention.

However, since the final evaluation of the testability is carried out using the logic-level test vector generation, more accurate evaluation of testability is possible when compared with the case in which it is done only by the function-level test vector generation and fault simulation, which is an important point of the present preferred embodiment.

Although in this embodiment the logic-level test vector generation and circuit conversion are performed only once, it is in some cases effective to repeat them several times, which can be taken as another embodiment of the present invention.

Although a list of undetected faults is transferred to the circuit converting means 4 as a result of the testability analysis by the logic-level test vector generating means 2 in this embodiment, it is not necessarily limited to the list of undetected faults, but may be replaced with a list of difficult-to-observe points or difficult-to-control points or the like.

As described above, according to the present invention of claims 1 to 3, since accurate analysis of the testability can be conducted in a logic level and, according to the result thereof, the circuit conversion for test facilitation is rendered only to points difficult to test, it is possible to automatically generate an easy-to-test logic circuit without adversely affecting cost and delay time to a substantial extent when compared with conventional methods.

Accordingly, the resulting practical effect is of great significance in view of the fact that enhancement of the testability is intensely required with an increase in the integrated density of LSIs.

In addition, although logic-level test vector generating means is employed in claim 1 to conduct the testability analysis in the logic level, this method has a problem that as the integrated density of a circuit becomes larger, processing time will increase.

Thus, function-level test vector generating means is employed in claim 2 so that a test vector is generated directly from a functional description, and a fault simulation is conducted using this test vector thereby to perform a testability analysis in a logic level.

This method is advantageous in that processing time is reduced as compared with the method in claim 1, while on the other hand the testability analysis is looser than that of claim 1, resulting in a cost increase.

Thus, in claim 3, the logic-level test vector generation is conducted with limitations to faults reported as undetected faults by the fault simulation, as described previously, so that the processing time and the precision of the testability analysis are made consistent with each other by refining faults to ones actually difficult to detect.

Although the present invention has been fully described by way of example with reference to the accompanying drawings, it is to be noted that various changes and modifications will be apparent to those skilled in the art. Therefore, unless otherwise such changes and modifications depart from the scope of the invention as defined by the appended claims, they should be construed as included therein.

What is claimed is:

1. A logic circuit generator for automatically generating a logic circuit from a given functional description, comprising:

logic synthesizing means for synthesizing a logic circuit that implements functions specified by said functional description;

logic-level test vector generating a test vector for use in a fault detection by analyzing the logic circuit synthesized by said logic synthesizing means, and further for outputting a fault detection rate and results of a testability analysis regarding the generated test vector;

judging means for deciding whether or not said fault detection rate outputted from said logic-level test vector generating means is greater than a predefined value; and circuit converting means for, when it is judged as a result of a decision made by said judging means that said fault detection rate is lower than the predefined value logic circuit synthesized by said logic synthesizing means according to said results of the testability analysis outputted from said logic-level test vector generating means so as to eliminate difficult-to-test portions of said logic circuit and redundancies thereof, and to satisfy given design restrictions, wherein said circuit converting means performs the following functions:

(i) inserting a test circuit into a portion of said logic circuit according to said results of the testability analysis outputted from said logic-level test vector generating means;

(ii) optimizing said logic circuit by eliminating redundancy in said logic circuit as a result of said test circuit insertion; and (iii) adjusting said logic circuit by converting said logic circuit obtained from said optimizing step so as to satisfy said given design restrictions when it is determined that said logic circuit obtained from said optimizing step does not satisfy said given design restrictions.

2. A logic circuit generator for automatically generating a logic circuit from a given functional description, comprising:

logic synthesizing means for synthesizing a logic circuit that implements functions specified by said functional description;

function-level test vector generating means for generating a test vector for use in a fault detection from said functional description;

fault simulating means for performing a fault simulation to the logic circuit synthesized by said logic synthesizing means, using the test vector generated by said function-level test vector generating means, and for outputting a fault detection rate and results of a testability analysis regarding said generated test vector;

judging means for deciding whether or not said fault detection rate outputted from said fault simulating means is greater than a predefined value; and circuit converting means for, when it is judged as a result of a decision made by said judging means that the fault detection rate is lower than the predefined value, converting logic circuit synthesized by said logic synthesizing means according to said results of the testability analysis outputted from said fault simulating means so as to eliminate difficult-to-test portions of said logic circuit and redundancies thereof, and to satisfy given design restrictions, wherein said circuit converting means performs the following functions:

(i) inserting a test circuit into a portion of said logic circuit according to said results of the testability analysis outputted from said fault simulating means;

(ii) optimizing said logic circuit by eliminating redundancy in said logic circuit as a result of said test circuit insertion; and (iii) adjusting said logic circuit by converting said logic circuit obtained from said optimizing step so as to satisfy said given design restrictions when it is determined that said logic circuit obtained from said optimizing step does not satisfy said given design restrictions.

3. A logic circuit generator for automatically generating a logic circuit from a given functional description, comprising:

logic synthesizing means for synthesizing a logic circuit that implements functions specified by said given functional description;

function-level test vector generating means for generating a first test vector from said given functional description;

fault simulating means for performing a fault simulation to the logic circuit synthesized by said logic synthesizing means, using said first test vector generated by said function-level test vector generating means, and for outputting a first fault detection rate and a first list of undetected faults regarding said first test vector;

judging means for deciding whether or not said first fault detection rate is higher than a predefined value;

logic-level test vector generating means for generating a second test vector by analyzing said logic circuit according to said first list of undetected faults, and further for outputting a second fault detection rate and results of a testability analysis obtained when the generated second test vector and said first test vector are combined together, said second fault detection rate being inputted to said judging means; and circuit converting means for, when it is judged as a result of a decision made by said judging means that said second fault detection rate is lower than the predefined value, converting said logic circuit synthesized by said logic-level synthesizing means according to said results of the testability analysis outputted from said logic-level test vector generating means so as to eliminate difficult-to-test portions of said logic circuit and redundancies thereof, and to satisfy given design restrictions, wherein said circuit converting means performs the following functions:
  (i) inserting a test circuit into a portion of said logic circuit according to said results of the testability analysis outputted from said logic-level test vector generating means;
  (ii) optimizing said logic circuit by eliminating redundancy in said logic circuit as a result of said test circuit insertion; and
  (iii) adjusting said logic circuit by converting said logic circuit obtained from said optimizing step so as to satisfy said given design restrictions when it is determined that said logic circuit obtained from said optimizing step does not satisfy said given design restrictions.

4. A logic circuit generating method for automatically generating a logic circuit from a given functional description, comprising the steps of
  synthesizing a logic circuit which satisfies functions defined according to said given functional description;
  generating a test vector in a logic level for testing said logic circuit synthesized by analyzing said logic circuit and outputting a fault detection rate and additionally outputting results of a testability analysis regarding said test vector generated, said fault detection rate being defined as a ratio of detected faults to all faults;
  judging whether or not said fault detection rate is higher than a predefined value; and,
  when said fault detection rate is judged to be lower than the predefined value, deforming said logic circuit according to said results of the testability analysis so as to eliminate difficult-to-test portions of said logic circuit and redundancies thereof, and to satisfy given design restrictions, wherein said deforming step comprises:
    (i) inserting a test circuit into a portion of said logic circuit according to said results of the testability analysis;
    (ii) optimizing said logic circuit by eliminating redundancy in said logic circuit as a result of said test circuit insertion; and
    (iii) adjusting said logic circuit by converting said logic circuit obtained from said optimizing step so as to satisfy said given design restrictions when it is determined that said logic circuit obtained from said optimizing step does not satisfy said given design restrictions.

5. A logic circuit generating method for automatically generating a logic circuit from a given functional description, comprising the steps of:
  synthesizing a logic circuit which satisfies functions defined according to said given functional description;
  generating test vectors in a functional level for testing said logic circuit according to said given functional description;
  performing a fault simulation about said logic circuit synthesized using said test vectors generated, and outputting a fault detection rate of said test vector and results obtained by analyzing testability of said logic circuit;
  judging whether or not said fault detection rate is higher than a predefined value; and
  converting said logic circuit synthesized based on said results obtained by the testability analysis, when said fault detection rate is judged to be lower than the predefined value, so as to eliminate difficult-to-test portions of said logic circuit and redundancies thereof and to satisfy given design restrictions, wherein said converting step comprises:
    (i) inserting a test circuit into a portion of said logic circuit according to said results of the testability analysis;
    (ii) optimizing said logic circuit by eliminating redundancy in said logic circuit as a result of said test circuit insertion; and
    (iii) adjusting said logic circuit by converting said logic circuit obtained from said optimizing step so as to satisfy said given design restrictions when it is determined that said logic circuit obtained from said optimizing step does not satisfy said given design restrictions.

6. A logic circuit generating method for automatically generating a logic circuit from a given functional description, comprising the steps of:
  synthesizing a logic circuit which satisfies functions defined according to said given functional description;
  generating a first test vector in a functional level according to said given functional description;
  executing a fault simulation with respect to said logic circuit synthesized, using said first test vector to evaluate a first fault detection rate when said first test vector is used, and to output a first list of undetected faults;
  judging whether or not said first fault detection rate is higher than a predefined value;
  generating a second test vector by analyzing said first list of undetected faults, and outputting a second fault detection rate and results of a testability analysis obtained from a combined vector of said first and second test vectors; and
  deforming, when said second fault detection rate is judged to be lower than the predefined value, said logic circuit based on said results of said testability analysis so as to eliminate difficult-to-test portions of said logic circuit and redundancies thereof, and to satisfy given design restrictions, wherein said deforming step comprises:

(i) inserting a test circuit into a portion of said logic circuit according to said results of the testability analysis;
(ii) optimizing said logic circuit by eliminating redundancy in said logic circuit as a result of said test circuit insertion; and
(iii) adjusting said logic circuit by converting said logic circuit obtained from said optimizing step so as to satisfy said given design restrictions when it is determined that said logic circuit obtained from said optimizing step does not satisfy said given design restrictions.

* * * * *

UNITED STATES PATENT AND TRADEMARK OFFICE
CERTIFICATE OF CORRECTION

PATENT NO. : 5,345,393
DATED : September 6, 1994
INVENTOR(S) : Masahiko UEDA

It is certified that error appears in the above-indentified patent and that said Letters Patent is hereby corrected as shown below:

<u>Col. 17</u>,

Line 46, after "generating" insert --means for generating--; and

Line 59, after "value" insert --, converting the--.

Signed and Sealed this

Twenty-second Day of August, 1995

Attest:

BRUCE LEHMAN

Attesting Officer

Commissioner of Patents and Trademarks